United States Patent
Husson et al.

(10) Patent No.: US 10,006,122 B2
(45) Date of Patent: Jun. 26, 2018

(54) ORGANODISILANE PRECURSORS FOR ALD/CVD SILICON-CONTAINING FILM APPLICATIONS

(71) Applicant: American Air Liquide, Inc., Fremont, CA (US)

(72) Inventors: Guillaume Husson, Wilmington, DE (US); Glenn Kuchenbeiser, Newark, DE (US); Venkateswara R. Pallem, Hockessin, DE (US)

(73) Assignee: American Air Liquide, Inc., Fremont, CA (US)

( * ) Notice: Subject to any disclaimer, the term of this patent is extended or adjusted under 35 U.S.C. 154(b) by 0 days. days.

(21) Appl. No.: 15/515,666

(22) PCT Filed: Oct. 2, 2015

(86) PCT No.: PCT/US2015/053818
§ 371 (c)(1),
(2) Date: Mar. 30, 2017

(87) PCT Pub. No.: WO2016/054566
PCT Pub. Date: Apr. 7, 2016

(65) Prior Publication Data
US 2017/0298510 A1    Oct. 19, 2017

Related U.S. Application Data

(60) Provisional application No. 62/059,060, filed on Oct. 2, 2014.

(51) Int. Cl.
*C23C 16/455* (2006.01)
*C23C 16/40* (2006.01)
(Continued)

(52) U.S. Cl.
CPC ...... *C23C 16/45553* (2013.01); *C23C 16/347* (2013.01); *C23C 16/401* (2013.01); *C23C 16/4482* (2013.01)

(58) Field of Classification Search
None
See application file for complete search history.

(56) References Cited

U.S. PATENT DOCUMENTS

| 5,204,141 A | 4/1993 | Roberts et al. |
| 6,465,387 B1 | 10/2002 | Pinnavaia et al. |

(Continued)

FOREIGN PATENT DOCUMENTS

| EP | 2 392 691 | 12/2011 |
| JP | 2006 096675 | 4/2006 |

(Continued)

OTHER PUBLICATIONS

Schuh, H. et al., "Disilanyl-amines—compounds comprising the structural unit Si—Si—N, as single-source precursors for plasma-enhanced chemical vapour deposition (PE-CVD) of silicon nitride," A. Anorg. Allg. Chem. 619 (1993) 1347-1352.

(Continued)

*Primary Examiner* — Joseph A Miller, Jr.
(74) *Attorney, Agent, or Firm* — Patricia E. McQueeney

(57) ABSTRACT

Disclosed are Si-containing film forming composition comprising organodisilane precursors. The organodisilane precursors have the formula $(E-(CR)_n-E)SiH_2-SiH_x(E-(CR)_n-E)_{3-x}$, wherein x is 2 or 3; each n is independently 1 or 3; each $(E-(CR)_n-E)$ group is a monoanionic bidentate ligand bonding to the Si through each E; each E is independently chosen from NR, O or S; and each R is independently selected from the group consisting of H, a C1 to C6 alkyl group, and a C3-C20 aryl or heterocycle group. Also disclosed are methods of synthesizing the Si-containing film (Continued)

forming compositions and methods of using the same to deposit silicon-containing films using vapor deposition processes for manufacturing semiconductors, photovoltaics, LCD-TFT, flat panel-type devices, refractory materials, or aeronautics.

20 Claims, 1 Drawing Sheet

(51) Int. Cl.
  *C23C 16/448* (2006.01)
  *C23C 16/34* (2006.01)

(56) References Cited

U.S. PATENT DOCUMENTS

| | | |
|---|---|---|
| 7,192,626 B2 | 3/2007 | Dussarrat et al. |
| 7,875,312 B2 | 1/2011 | Thridandam et al. |
| 9,453,035 B2 | 9/2016 | Sanchez et al. |
| 2010/0164057 A1 | 7/2010 | Hunks et al. |
| 2013/0319290 A1 | 12/2013 | Xiao et al. |
| 2013/0323435 A1 | 12/2013 | Xiao et al. |
| 2015/0094470 A1 | 4/2015 | Sanchez et al. |

FOREIGN PATENT DOCUMENTS

| | | |
|---|---|---|
| WO | WO 2006 097525 | 9/2006 |
| WO | WO 2014 015237 | 1/2014 |
| WO | WO 2014 015241 | 1/2014 |
| WO | WO 2014 015248 | 1/2014 |
| WO | WO 2014 015232 | 11/2014 |

OTHER PUBLICATIONS

Gonzalez-Garcia, G. et al., "Pentacoordinate mono(β-diketonato)- and hexacoordinate bis-(β-diketonato)_-silicon(IV) complexes obtained from (thiocyanato-N)hydridosilanes," Polyhedron 41 (2012) 127-133.

Kano, N. et al., "A disilane containing two heptacoordinate silicon atoms and dithiocarboxylate ligands," Angew. Chem. 2001, 113, No. 18, 3558-3560.

Wheeler, D. et al., ".Aminodisilanes as silylating agents for dry-developed postive-tone resists for deep ultraviolet (248nm) and extreme ultraviolet (13.5nm) microlithography," Proceedings of SPIE 2438, Advances in Resist Technology and Processing XII, Jun. 9, 1995, 762-774.

International Search Report and Written Opinion for corresponding PCT/US2015/053818, dated Jan. 7, 2016.

ORGANODISILANE PRECURSORS FOR ALD/CVD SILICON-CONTAINING FILM APPLICATIONS

CROSS REFERENCE TO RELATED APPLICATIONS

The present application is a 371 of International PCT Application No. PCT/US2015/053818 filed Oct. 2, 2015, which claims the benefit of U.S. Provisional Application Ser. No. 62/059,060 filed Oct. 2, 2014, the entire contents of both herein incorporated by reference in its entirety for all purposes.

TECHNICAL FIELD

Disclosed are Si-containing film forming compositions comprising organodisilane precursors. The organodisilane precursors have the formula $(E-(CR)_n-E)SiH_2—SiH_x(E-(CR)_n-E)_3$, wherein x is 2 or 3; each n is independently 1 or 3; each $(E-(CR)_n-E)$ group is a monoanionic bidentate ligand bonding to the Si through each E; each E is independently chosen from NR, O or S; and each R is independently selected from the group consisting of H, a C1 to C6 alkyl group, and a C3-C20 aryl or heterocycle group. Also disclosed are methods of synthesizing the Si-containing film forming compositions and methods of using the same to deposit silicon-containing films using vapor deposition processes for manufacturing semiconductors, photovoltaics, LCD-TFT, flat panel-type devices, refractory materials, or aeronautics.

BACKGROUND

Si-containing thin films are used widely in the semiconductor, photovoltaic, LCD-TFT, flat panel-type device, refractory material, or aeronautic industries. Si-containing thin films may be used, for example, as dielectric materials having electrical properties which may be insulating ($SiO_2$, SiN, SiCN, SiCOH, $MSiO_x$, wherein M is Hf, Zr, Ti, Nb, Ta, or Ge, and x is greater than zero), Si-containing thin films may be used as conducting films, such as metal silicides or metal silicon nitrides. Due to the strict requirements imposed by downscaling of electrical device architectures towards the nanoscale (especially below 28 nm node), increasingly fine-tuned molecular precursors are required which meet the requirements of volatility (for ALD process), lower process temperatures, reactivity with various oxidants and low film contamination, in addition to high deposition rates, conformality and consistency of films produced.

Hunks et al. disclose a wide range of Si-containing precursors in US2010/0164057, including silicon compounds having the formula $R_{4-x}SiL_x$, wherein x is an integer having a value from 1 to 3; R may be selected from H, branched and unbranched C1-C6 alkyl, C3-C8 cycloalkyl, and C6-C13 aryl groups; and L may be selected from isocyanato, methylethylketoxime, trifluoroacetate, triflate, acyloxy, μ-diketiminate, μ-diiminate, amidinate, guanidinate, alkylamino, hydride, alkoxide, or formate ligands. Pinnavaia et al. claim a method for the preparation of a porous synthetic, semi-crystalline hybrid organic-inorganic silicon oxide composition from silicon acetylacetonate and silicon 1,3-diketonate precursors (U.S. Pat. No. 6,465,387).

In *Proceedings of SPIE* 2438, Advances in Resist Technology and Processing XII, 762 (Jun. 9, 1995), Wheeler et al. disclose aminodisilanes used as silylating reagents for near-surface imaging with deep-UV (248 nm) and EUV (13.5 nm) lithography.

Disilane containing precursors bearing both alkyl and amino groups have been disclosed for deposition of SiCN thin films by Tsukada and Dussarrat in JP 2006096675.

Xiao et al. disclose another family of Si-containing precursors in US2013/0323435 which have the formula $(R^1R^2N)_n—SiH_{3-n}SiH_3$ wherein $R^1$ is selected from linear or branched C3 to C10 alkyl group, linear or branched C3 to C10 alkenyl group, linear or branched C3 to C10 alkynyl group, C1 to C6 dialkylamino group, electron withdrawing group, and C6 to C10 aryl group; $R^2$ is selected from hydrogen, linear or branched C1 to C10 alkyl group, linear or branched C3 to C6 alkenyl group, linear or branched C3 to C6 alkynyl group, C1 to C6 dialkylamino group, C6 to C10 aryl group, linear or branched C1 to C6 fluorinated alkyl group, electron withdrawing group, and C4 to C10 aryl group; optionally wherein $R^1$ and $R^2$ are linked together to form ring selected from substituted or unsubstituted aromatic ring or substituted or unsubstituted aliphatic ring; and n=1 or 2.

Additionally, Xiao et al also disclose another family of Si-containing precursors in US2013/0319290 which have the formula $(R^1R^2N)—SiH_2SiH_2—(NR^3R^4)$ and methods for forming silicon-containing films and wherein $R^1$ and $R^3$ are independently selected from linear or branched C3 to C10 alkyl group, a linear or branched C3 to C10 alkenyl group, a linear or branched C3 to C10 alkynyl group, a C1 to C6 dialkylamino group, an electron withdrawing and a C6 to C10 aryl group; R2 and R4 are independently selected from hydrogen, a linear or branched C3 to C10 alkyl group, a linear or branched C3 to C10 alkenyl group, a linear or branched C3 to C10 alkynyl group, a C1 to C6 dialkylamino group, an electron withdrawing, and a C6 to C10 aryl group; and wherein any one, all, or none of $R^1$ and $R^2$, $R^3$ and $R^4$, $R^1$ and $R^3$, or $R^2$ and $R^4$ are linked to form a ring.

Recently Dussarrat et al. disclosed silicon amidinate precursors in WO2014/015232, which have the form $H_3Si$ (amd), and silicon β-diketiminate precursors in WO2014/015237, each of which demonstrate the utility of the chelating ligand framework to support the $—SiH_3$ functionality. The same authors also disclosed related oxygen containing precursors based upon chelating O—O and N—O delocalized ligand frameworks [see WO2014/015241 and WO2014/015248, respectively].

Sanchez et al. disclose compounds and methods of preparation of Si—X and Ge—X compounds (X=N, P, As, Sb) via dehydrogenative coupling between the corresponding unsubstituted silanes and amines (including $NH_3$) and phosphines catalyzed by metallic catalysts (US2015/0094470).

Despite the wide range of choices available for the deposition of Si containing films, additional precursors are continuously sought to provide device engineers the ability to tune manufacturing process requirements and achieve films with desirable electrical and physical properties.

Notation and Nomenclature

Certain abbreviations, symbols, and terms are used throughout the following description and claims, and include:

As used herein, the indefinite article "a" or "an" means one or more.

As used herein, the terms "approximately" or "about" mean±10% of the value stated.

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

As used herein, the term "alkyl group" refers to saturated functional groups containing exclusively carbon and hydrogen atoms. Further, the term "alkyl group" refers to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the term "aryl" refers to aromatic ring compounds where one hydrogen atom has been removed from the ring. As used herein, the term "heterocycle" refers to a cyclic compound that has atoms of at least two different elements as members of its ring.

As used herein, the abbreviation "Me" refers to a methyl group; the abbreviation "Et" refers to an ethyl group; the abbreviation "Pr" refers to any propyl group (i.e., n-propyl or isopropyl); the abbreviation "iPr" refers to an isopropyl group; the abbreviation "Bu" refers to any butyl group (n-butyl, iso-butyl, t-butyl, sec-butyl); the abbreviation "tBu" refers to a tert-butyl group; the abbreviation "sBu" refers to a sec-butyl group; the abbreviation "iBu" refers to an iso-butyl group; the abbreviation "Ph" refers to a phenyl group; the abbreviation "Am" refers to any amyl group (iso-amyl, sec-amyl, tert-amyl); the abbreviation "Cy" refers to a cyclic alkyl group (cyclobutyl, cyclopentyl, cyclohexyl, etc.); the abbreviation "R-fmd" refers to an R—N—C(H)—N—R formamidinate ligand, with R being an alkyl group (e.g., iPr-fmd is iPr—N—C(H)—N-iPr); and the abbreviation "R-amd" refers to an R—N—C(Me)-N—R amidinate ligand, with R being an alkyl group (e.g., iPr-amd is iPr—N—C(Me)-N-iPr).

As used herein, the acronym "SRO" stands for a Strontium Ruthenium Oxide film; the acronym "HCDS" stands for hexachlorodisilane; and the acronym "PCDS" stands for pentachlorodisilane.

The standard abbreviations of the elements from the periodic table of elements are used herein. It should be understood that elements may be referred to by these abbreviations (e.g., Si refers to silicon, N refers to nitrogen, O refers to oxygen, C refers to carbon, etc.).

SUMMARY

Si-containing film forming compositions comprising organodisilane precursors are disclosed. The organodisilane precursors have the following formula are disclosed:

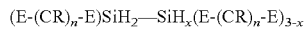

wherein x is 2 or 3; each n is independently 1 or 3; each (E-(CR)$_n$-E) group is a monoanionic bidentate ligand bonding to the Si through each E; each E is independently chosen from NR, O or S; and each R is independently selected from the group consisting of H, a C1 to C6 alkyl group, and a C3-C20 aryl or heterocycle group. The Si-containing film forming compositions may have one or more of the following aspects:

R being a C1 to C6 alkyl group;
Each R independently being H, Me, Et, Pr, or Bu;
x being 3;
n being 1;
having the formula:

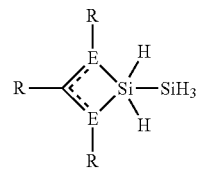

having the formula:

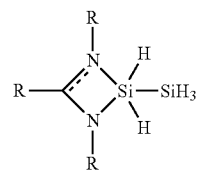

the organodisilane precursor being:

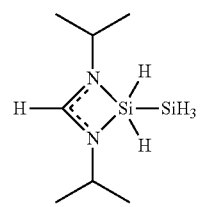

the organodisilane precursor being:

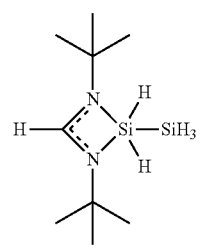

the organodisilane precursor being:

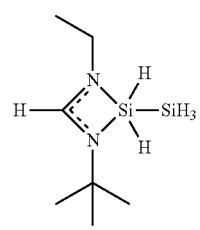

the organodisilane precursor being:
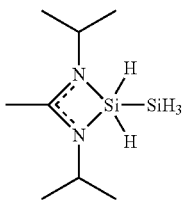
the organodisilane precursor being:
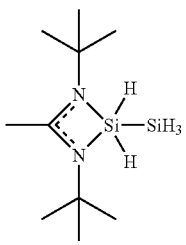
the organodisilane precursor being:
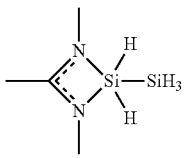
the organodisilane precursor being:
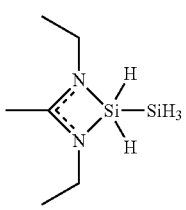
the organodisilane precursor being:
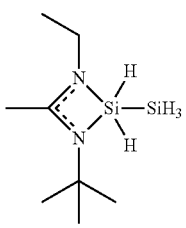
the organodisilane precursor being:
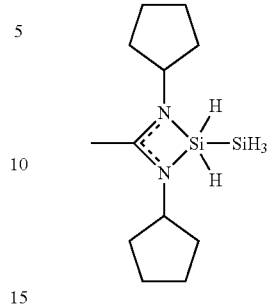
the organodisilane precursor being:
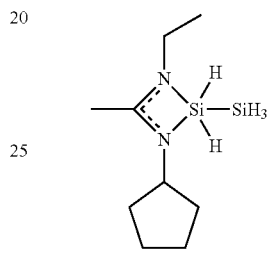
the organodisilane precursor being:
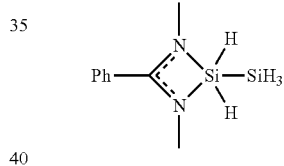
the organodisilane precursor being:
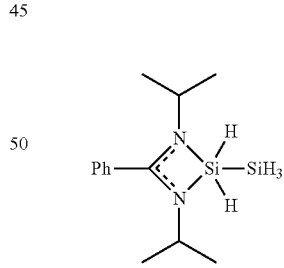
having the formula:
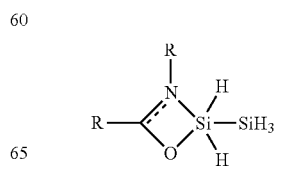

the organodisilane precursor being:

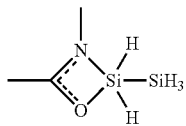

the organodisilane precursor being:

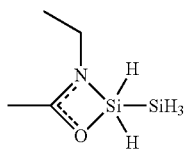

the organodisilane precursor being:

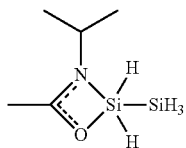

the organodisilane precursor being:

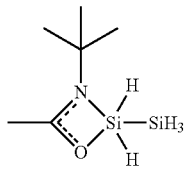

the organodisilane precursor being:

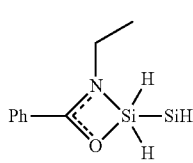

the organodisilane precursor being:

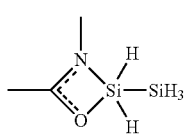

the organodisilane precursor being:

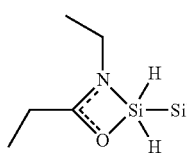

the organodisilane precursor being:

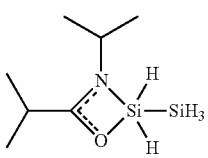

the organodisilane precursor being:

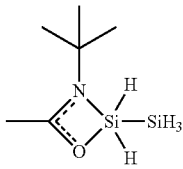

the organodisilane precursor being:

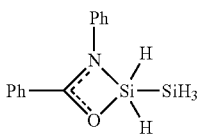

the organodisilane precursor being:

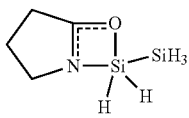

the organodisilane precursor being:

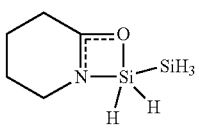

the organodisilane precursor being:

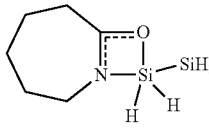

the organodisilane precursor being:

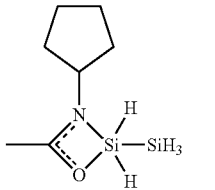

the organodisilane precursor being:

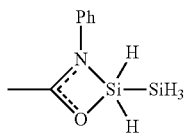

having the formula:

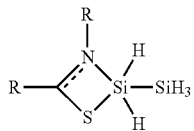

the organodisilane precursor being:

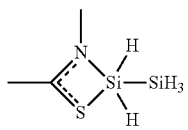

the organodisilane precursor being:

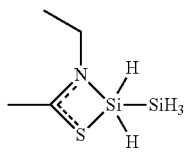

the organodisilane precursor being:

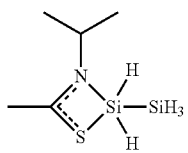

the organodisilane precursor being:

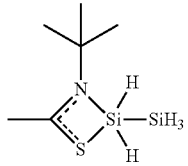

the organodisilane precursor being:

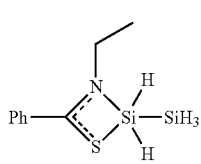

the organodisilane precursor being:

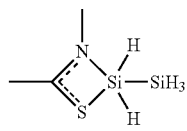

the organodisilane precursor being:

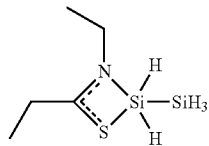

the organodisilane precursor being:

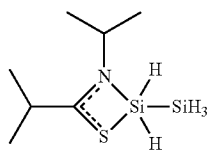

the organodisilane precursor being:

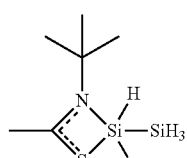

the organodisilane precursor being:

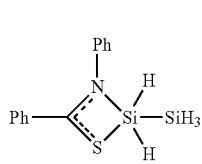

the organodisilane precursor being:

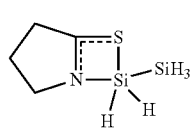

the organodisilane precursor being:

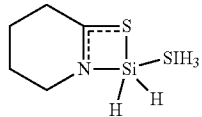

the organodisilane precursor being:

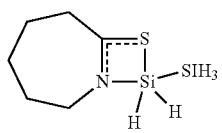

the organodisilane precursor being:

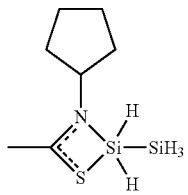

the organodisilane precursor being:

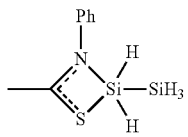

having the formula:

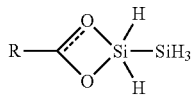

the organodisilane precursor being;

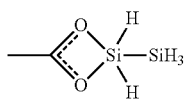

the organodisilane precursor being:

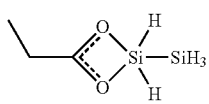

the organodisilane precursor being:

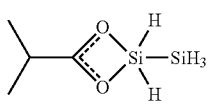

the organodisilane precursor being:

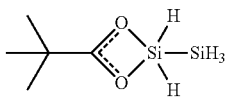

the organodisilane precursor being:

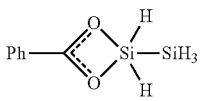

the organodisilane precursor being:

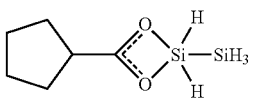

the organodisilane precursor being:

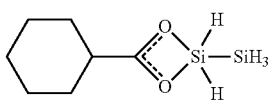

the organodisilane precursor being:

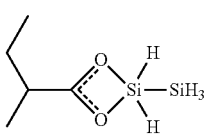

having the formula:

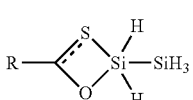

the organodisilane precursor being:

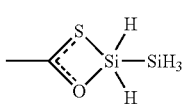

the organodisilane precursor being:

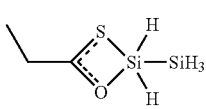

the organodisilane precursor being:

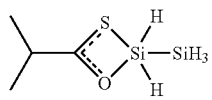

the organodisilane precursor being:

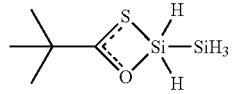

the organodisilane precursor being:

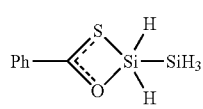

the organodisilane precursor being:

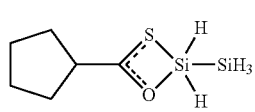

the organodisilane precursor being:

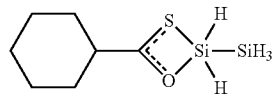

the organodisilane precursor being:

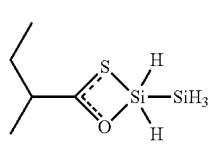

having the formula:

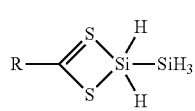

the organodisilane precursor being:

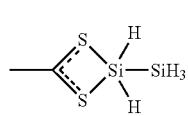

the organodisilane precursor being:

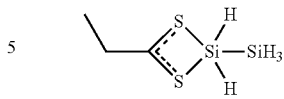

the organodisilane precursor being:

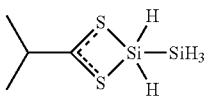

the organodisilane precursor being:

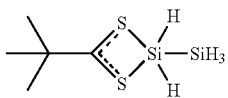

the organodisilane precursor being:

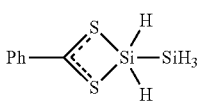

the organodisilane precursor being:

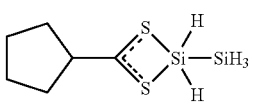

the organodisilane precursor being:

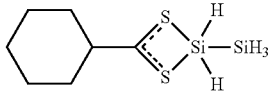

the organodisilane precursor being:

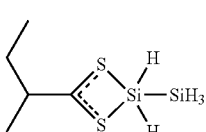

n being 3;
having the formula:

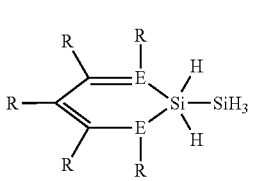

having the formula:

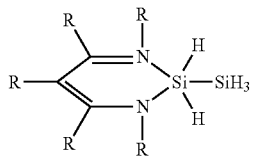

the organodisilane precursor being:

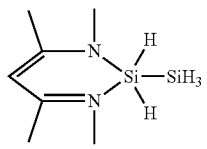

the organodisilane precursor being:

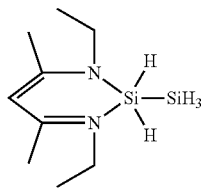

the organodisilane precursor being:

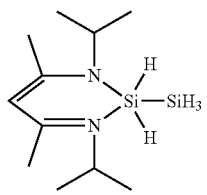

the organodisilane precursor being:

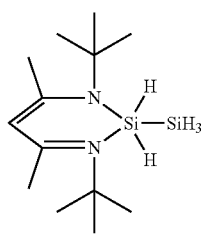

the organodisilane precursor being:

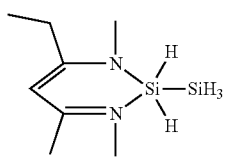

the organodisilane precursor being:

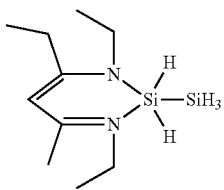

the organodisilane precursor being:

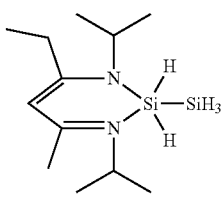

the organodisilane precursor being:

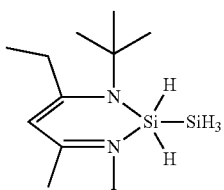

having the formula:

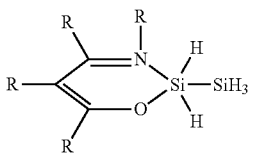

the organodisilane precursor being:

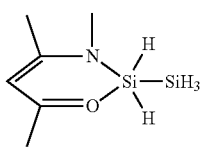

the organodisilane precursor being:

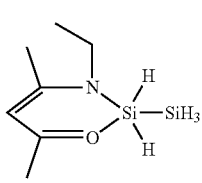

the organodisilane precursor being:

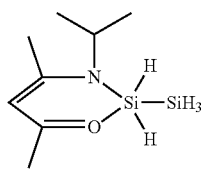

the organodisilane precursor being:

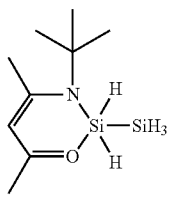

having the formula:

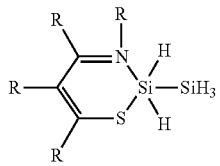

the organodisilane precursor being:

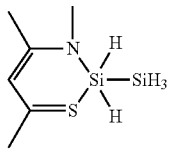

the organodisilane precursor being:

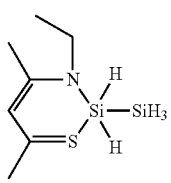

the organodisilane precursor being:

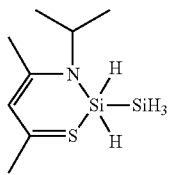

the organodisilane precursor being:

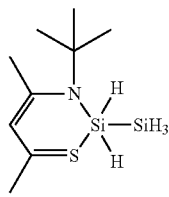

having the formula:

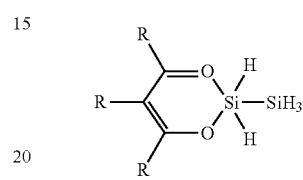

the organodisilane precursor being:

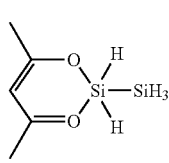

the organodisilane precursor being:

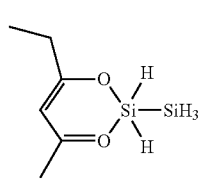

the organodisilane precursor being:

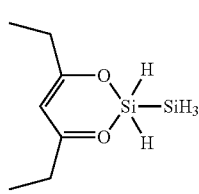

the organodisilane precursor being:

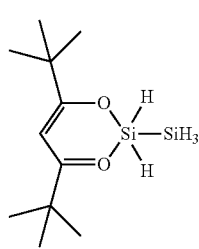

having the formula:

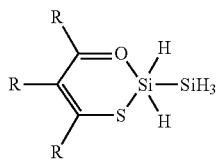

the organodisilane precursor being:

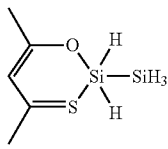

the organodisilane precursor being:

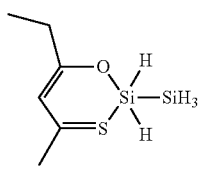

the organodisilane precursor being:

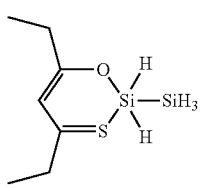

the organodisilane precursor being:

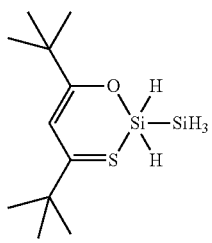

having the formula:

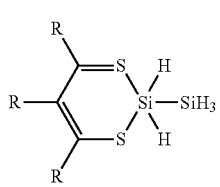

the organodisilane precursor being:

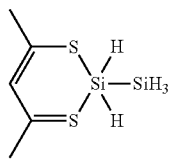

the organodisilane precursor being:

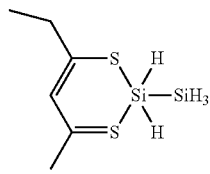

the organodisilane precursor being:

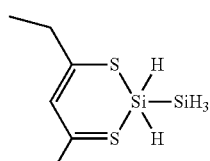

the organodisilane precursor being:

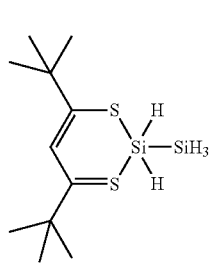

x being 2;
having the formula:

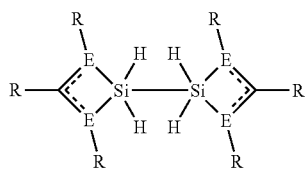

having the formula:

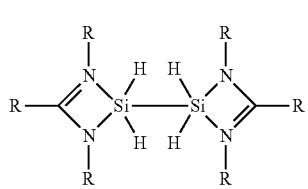
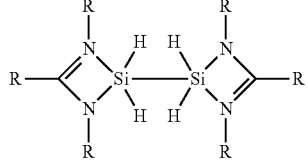

the organodisilane precursor being:

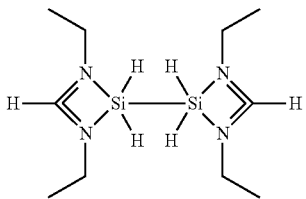

the organodisilane precursor being:

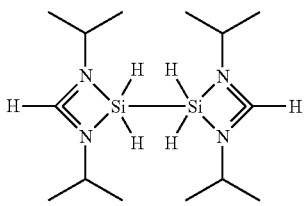

the organodisilane precursor being:

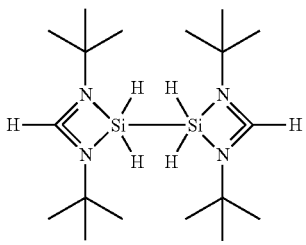

the organodisilane precursor being:

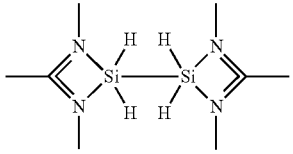

the organodisilane precursor being:

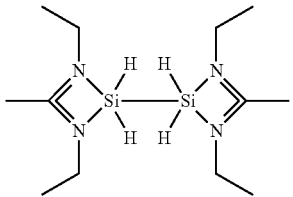

the organodisilane precursor being:

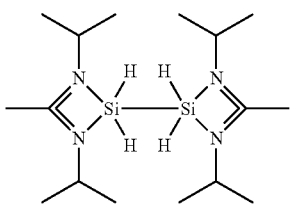

the organodisilane precursor being:

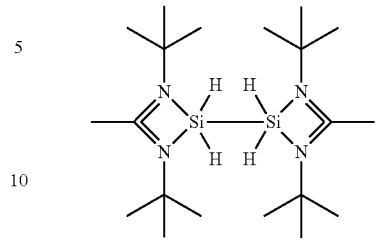

the organodisilane precursor being:

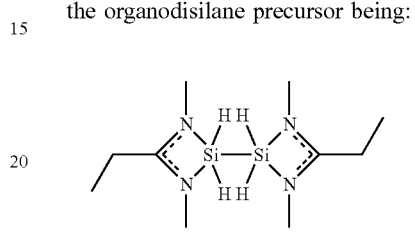

the organodisilane precursor being:

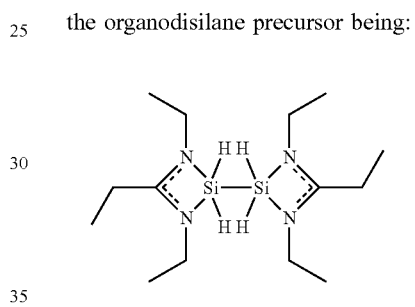

the organodisilane precursor being:

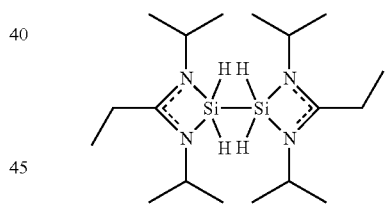

having the formula:

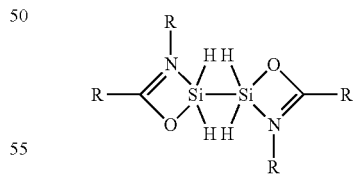

the organodisilane precursor being:

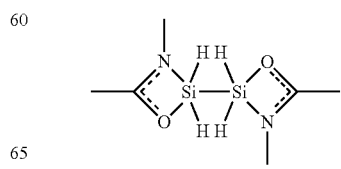

the organodisilane precursor being:

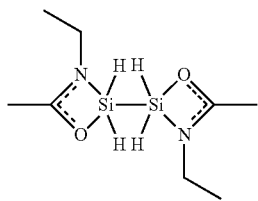

the organodisilane precursor being:

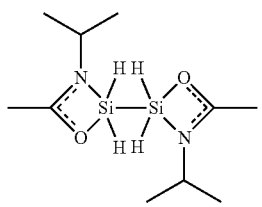

the organodisilane precursor being:

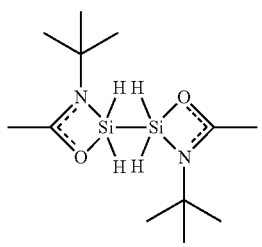

the organodisilane precursor being:

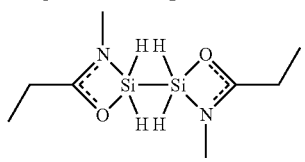

the organodisilane precursor being:

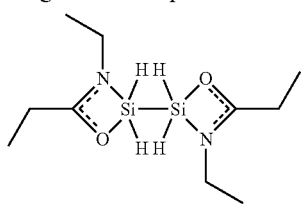

the organodisilane precursor being:

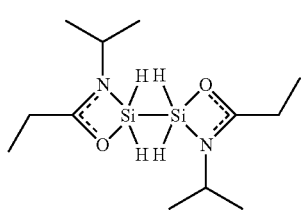

the organodisilane precursor being:

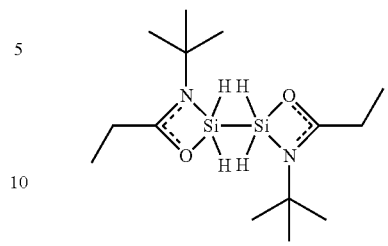

having the formula:

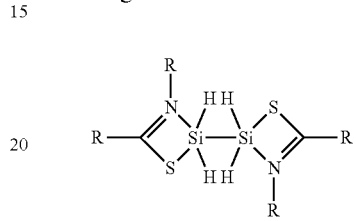

the organodisilane precursor being:

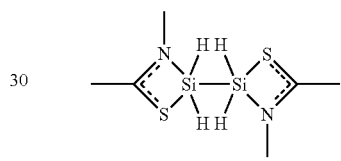

the organodisilane precursor being:

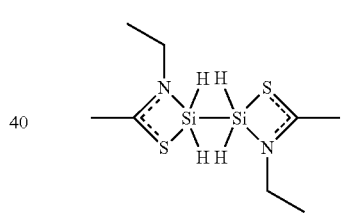

the organodisilane precursor being:

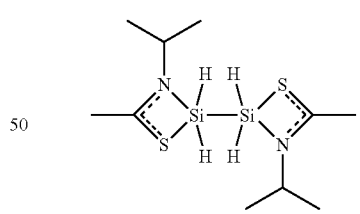

the organodisilane precursor being:

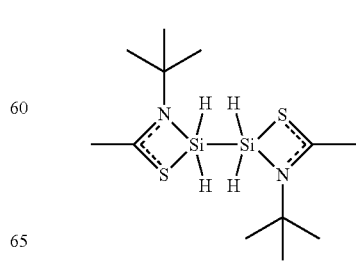

the organodisilane precursor being:

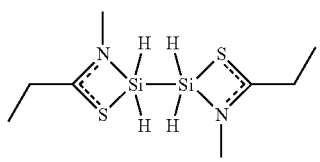

the organodisilane precursor being:

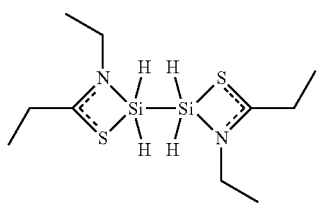

the organodisilane precursor being:

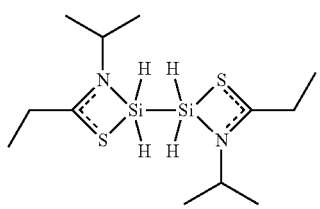

the organodisilane precursor being:

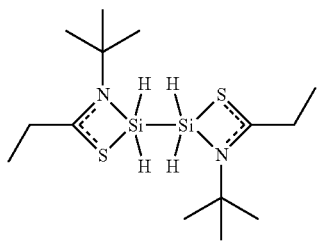

having the formula:

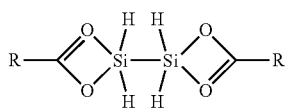

the organodisilane precursor being:

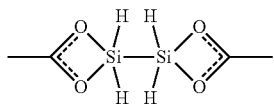

the organodisilane precursor being:

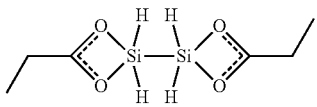

the organodisilane precursor being:

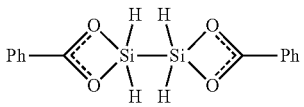

the organodisilane precursor being:

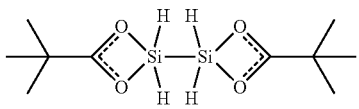

the organodisilane precursor being:

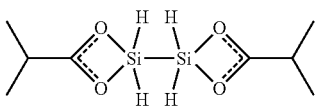

the organodisilane precursor being:

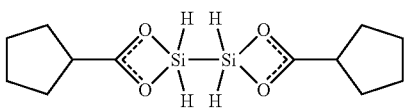

having the formula:

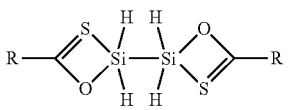

the organodisilane precursor being:

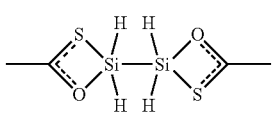

the organodisilane precursor being:

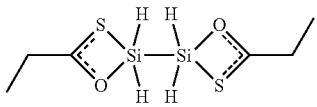

the organodisilane precursor being:

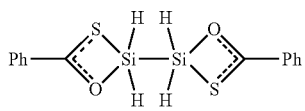

the organodisilane precursor being:

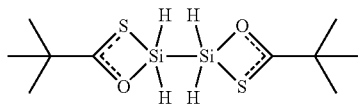

the organodisilane precursor being:

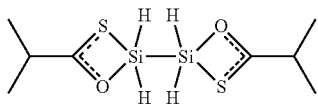

the organodisilane precursor being:

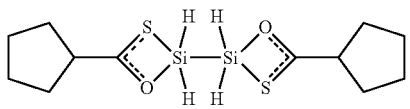

having the formula:

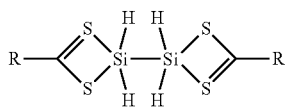

the organodisilane precursor being:

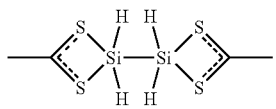

the organodisilane precursor being:

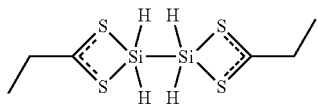

the organodisilane precursor being:

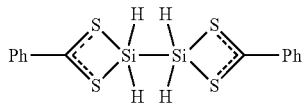

the organodisilane precursor being:

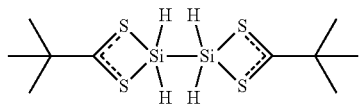

the organodisilane precursor being:

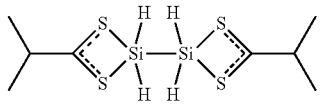

the organodisilane precursor being:

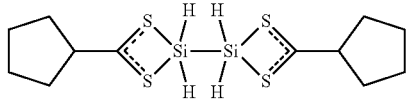

having the formula:

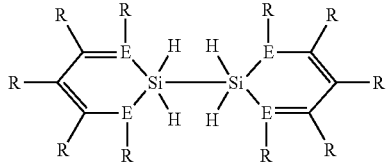

the Si-containing film forming composition comprising between approximately 0.1 molar % and approximately 50 molar % of the organodisilane precursor;
the Si-containing film forming composition comprising between approximately 93% w/w to approximately 100% w/w of the organodisilane precursor;
the Si-containing film forming composition comprising between approximately 99% w/w to approximately 100% w/w of the organodisilane precursor;
the Si-containing film forming composition comprising between approximately 0% w/w and 5% w/w of hexane, substituted hexane, pentane, substituted pentane, dimethyl ether, or anisole;
the Si-containing film forming composition comprising between approximately 0 ppmw and 200 ppmw of Cl;
further comprising a solvent;
the solvent being selected from the group consisting of C1-C16 hydrocarbons, THF, DMO, ether, pyridine, and combinations thereof;
the solvent being a C1-C16 hydrocarbon;
the solvent being tetrahydrofuran (THF);
the solvent being dimethyl oxalate (DMO);
the solvent being ether;
the solvent being pyridine;
the solvent being ethanol; or
the solvent being isopropanol.

Also disclosed is a Si-containing film forming composition delivery device comprising a canister having an inlet conduit and an outlet conduit and containing any of the Si-containing film forming compositions disclosed above. The disclosed device may include one or more of the following aspects:

the Si-containing film forming composition having a total concentration of metal contaminants of less than 10 ppmw;

an end of the inlet conduit end located above a surface of the Si-containing film forming composition and an end of the outlet conduit located below the surface of the Si-containing film forming composition;

an end of the inlet conduit end located below a surface of the Si-containing film forming composition and an end of the outlet conduit located above the surface of the Si-containing film forming composition;

further comprising a diaphragm valve on the inlet and the outlet;

the Si-containing film forming composition being:

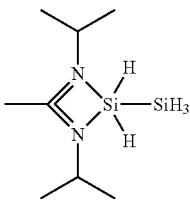

Also disclosed are methods of depositing a Si-containing layer on a substrate. The vapor of any of the Si-containing film forming compositions disclosed above is introduced into a reactor having a substrate disposed therein. At least part of the organodisilane precursor is deposited onto the substrate to form a Si-containing layer using a vapor deposition method. The disclosed methods may have one or more of the following aspects:

introducing into the reactor a vapor comprising a second precursor;

the second precursor comprising an element selected from the group consisting of group 2, group 13, group 14, transition metal, lanthanides, and combinations thereof;

the element of the second precursor being selected from Mg, Ca, Sr, Ba, Zr, Hf, Ti, Nb, Ta, Al, Si, Ge, Y, or lanthanides;

introducing a co-reactant into the reactor;

the co-reactant being selected from the group consisting of $O_2$, $O_3$, $H_2O$, $H_2O_2$, NO, $NO_2$, a carboxylic acid, radicals thereof, and combinations thereof;

the co-reactant being plasma treated oxygen;

the co-reactant being ozone;

the Si-containing layer being a silicon oxide layer;

the co-reactant being selected from the group consisting of $H_2$, $NH_3$, $(SiH_3)_3N$, hydridosilanes (such as $SiH_4$, $Si_2H_6$, $Si_3H_8$, $Si_4H_{10}$, $Si_5H_{10}$, $Si_6H_{12}$), chlorosilanes and chloropolysilanes (such as $SiHCl_3$, $SiH_2Cl_2$, $SiH_3Cl$, $Si_2Cl_6$, $Si_2HCl_5$, $Si_3Cl_8$), alkylsilanes (such as $Me_2SiH_2$, $Et_2SiH_2$, $MeSiH_3$, $EtSiH_3$), hydrazines (such as $N_2H_4$, $MeHNNH_2$, MeHNNHMe), organic amines (such as $NMeH_2$, $NetH_2$, $Nme_2H$, $NEt_2H$, $Nme_3$, $NEt_3$, $(SiMe_3)_2NH$), pyrazoline, pyridine, B-containing molecules (such as $B_2H_6$, 9-borabicylo[3,3,1]none, trimethylboron, triethylboron, borazine), alkyl metals (such as trimethylaluminum, triethylaluminum, dimethylzinc, diethylzinc), radical species thereof, and mixtures thereof;

the co-reactant being selected from the group consisting of $H_2$, $NH_3$, $SiH_4$, $Si_2H_6$, $Si_3H_8$, $SiH_2Me_2$, $SiH_2Et_2$, $N(SiH_3)_3$, hydrogen radicals thereof, and mixtures thereof;

the co-reactant being HCDS or PCDS;

the vapor deposition method being a chemical vapor deposition process;

the vapor deposition method being an atomic layer deposition (ALD) process;

the vapor deposition method being a spatial ALD process;

the silicon-containing layer being Si;

the silicon-containing layer being $SiO_2$;

the silicon-containing layer being SiN;

the silicon-containing layer being SiON;

the silicon-containing layer being SiCN; and the silicon-containing layer being SiCOH.

Also disclosed are methods of forming Si-containing films on substrates. A solution comprising any of the Si-containing film forming compositions disclosed above is contacted with the substrate and the Si-containing film formed via a spin coating, spray coating, dip coating, or slit coating technique. The disclosed methods may include the following aspects:

the Si-containing film forming composition comprising ethanol;

the Si-containing film forming composition comprising isopropanol;

forming the Si-containing film via a spin coating technique;

forming the Si-containing film via a spray coating technique;

forming the Si-containing film via a dip coating technique;

forming the Si-containing film via a slit coating technique;

annealing the Si-containing film; or laser treating the Si-containing film.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1:
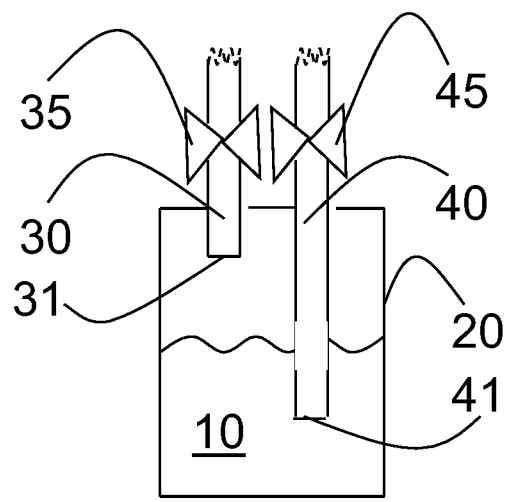
FIG. 1 is a side view of one embodiment of the Si-containing film forming composition chemistry delivery device disclosed herein.

Si-containing film forming compositions comprising organodisilane precursors are disclosed. The organodisilane precursors have the following formula:

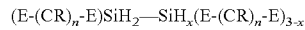

wherein x is 2 or 3, each n is independently 1 or 3, each $(E-(CR)_n-E)$ group is a monoanionic bidentate ligand bonding to the Si through each E, each E is independently chosen from O, S, or NR, and each R is independently H, a C1 to C6 alkyl group, or a C3-C20 aryl or heterocycle group.

The disclosed organodisilane precursors are derived from different classes of ligand systems, such as diketiminate, diketonate, ketoiminate, amidinate, thiodiketonate, dithiodiketonate, and/or thioketiminate ligands. The specific design of these precursors may help improve volatility, reduce the melting point (liquids or very low melting solids), increase reactivity with water, and increase thermal stability for wider process window applications.

As illustrated below, the E atoms are bonded to the silicon atom, resulting in a pentacoordinate Si(IV) center. The carbon atom in the backbone of the bidentate monoanionic ligand is $sp^2$ hybridized, resulting in a delocalized charge across the monoanionic ligand. The carbon atoms may independently be substituted by H, C1-C6 alkyl groups, aryl groups, or heterocycle groups.

The disclosed organodisilane precursors may be more reactive than other amino-substituted organodisilane precursors due to hypercoordination at one or both silicon atoms. In other words, although the silicon atom is +IV, the two Si—H bonds, one Si—Si bond, and the monoanionic chelating ligand results in a total of 5 bonds to the silicon atom.

The organodisilane precursor contains four or five hydrogen atoms directly bonded to the Si atom. These Si—H bonds may help increase the volatility of the precursor. The disclosed organodisilane precursors contain no Si-halogen bonds which is important because halogens may damage other layers in the substrate (e.g., low k layers, copper interconnect layers, etc.). Additionally, in ALD processes, the four or five Si—H bonds of the disclosed precursors may help to provide a larger growth rate per cycle when compared to the analogous Si-halogen containing precursors because the H atoms occupy less surface area, resulting in more molecules on the substrate surface. Inclusion of the SiH bonds (i.e., hydride functionality) may produce less steric bulk, which may allow the precursors higher reactivity to the substrate.

Each E may be NR. Due to their increased nitrogen content when compared to the when any of $L^1$ through $L^4$ is an oxygen or sulfur atom, these molecules may be used to produce silicon-containing films that also contain nitrogen, such as SiN, SiCN, SiON, MSiN, or MSiON, wherein M is an element such as Hf, Zr, Ti, Nb, Ta, or Ge, or to tune the amount of nitrogen in those films.

One of ordinary skill in the art will recognize that embodiments in which n=1 may produce precursors having higher volatility and lower melting points, being more suitable for vapor deposition. Embodiments in which n=3 may also be suitable for vapor deposition when the resulting silicon-containing film also contains carbon. Embodiments in which n=3 may also be suitable for casting deposition methods, such as spin-on or dip coating.

Exemplary organodisilane precursors wherein x=3, n=1, and each E=NR contain both amidinate and hydride functionalities and have the following formula:

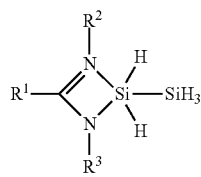

wherein $R^1$, $R^2$ and $R^3$ is independently H, a C1 to C6 alkyl group, or a C3-C20 aryl or heterocycle group. $R^1$ and $R^2$ and/or $R^1$ and $R^3$ may be joined to form cyclic chains.

Exemplary mono(formamidinato)disilanes include:

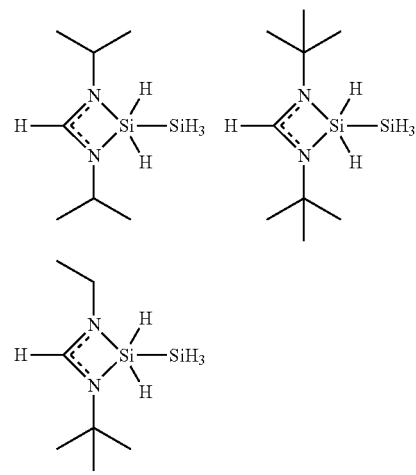

Exemplary mono(amidinato)disilanes include:

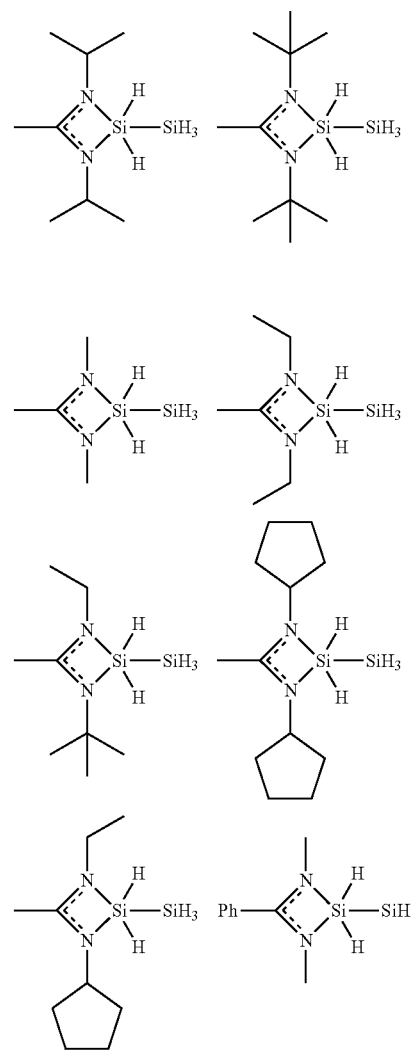

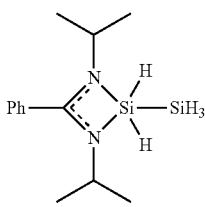

Exemplary organodisilane precursors wherein x=2, each n=1, and each E=NR contain both amidinate and hydride functionalities and have the following formula:

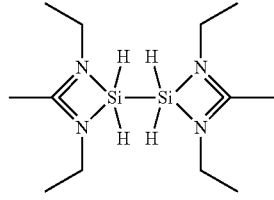

wherein $R^1$, $R^2$, $R^3$, $R^4$, $R^5$ and $R^6$ is independently H, a C1 to C6 alkyl group, or a C3-C20 aryl or heterocycle group. $R^1$ and $R^2$ and/or $R^1$ and $R^3$ and/or $R^4$ and $R^5$ and/or $R^5$ and $R^6$ may be joined to form cyclic chains.

Exemplary bis(formamidinato)disilanes include:

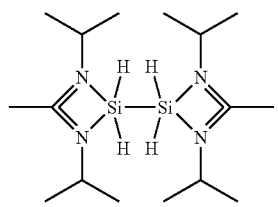

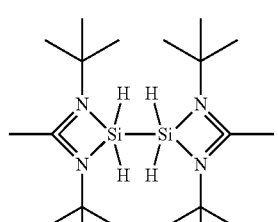

Exemplary bis(amidinato)disilanes include:

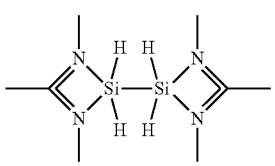

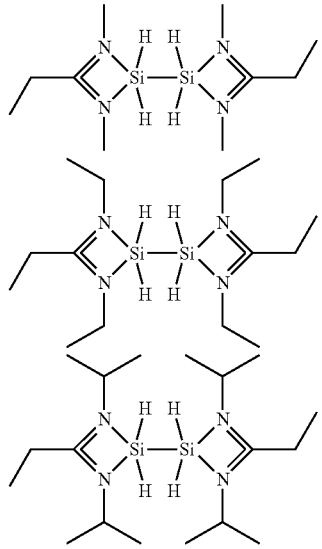

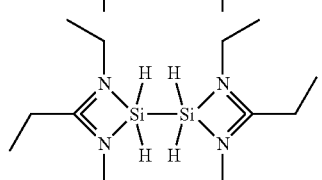

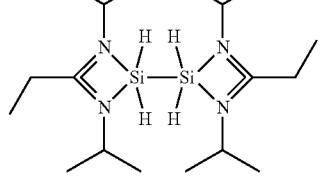

Exemplary organodisilane precursors wherein x=3, n=3, and each E=NR contain both β-diketiminate and hydride functionalities and have the following formula:

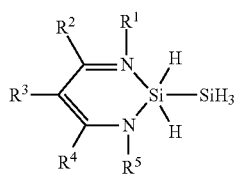

wherein $R^1$, $R^2$, $R^3$, $R^4$ and $R^5$ is independently H, a C1 to C6 alkyl group, or a C3-C20 aryl or heterocycle group. $R^1$ and $R^2$ and/or $R^2$ and $R^3$ and/or $R^3$ and $R^4$ and/or $R^4$ and $R^5$ may be joined to form cyclic chains.

Exemplary mono(β-diketiminate)disilanes include:

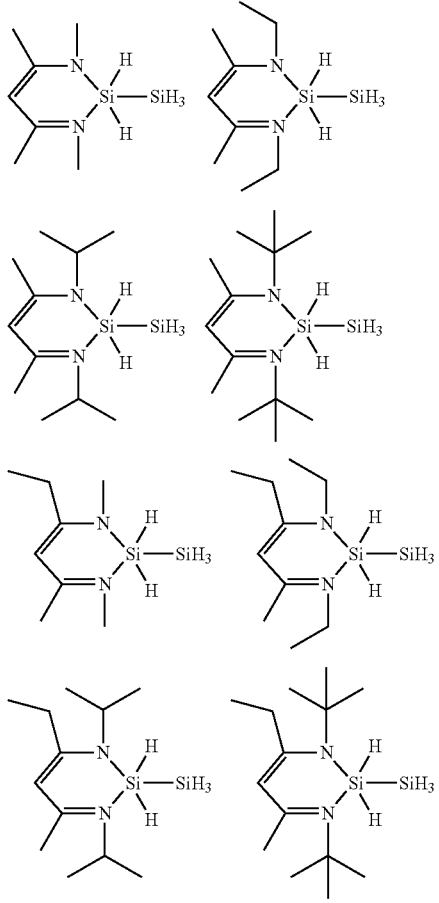

Exemplary organodisilane precursors wherein x=2, each n=3, and each E=NR contain both β-diketiminate and hydride functionalities and have the following formula:

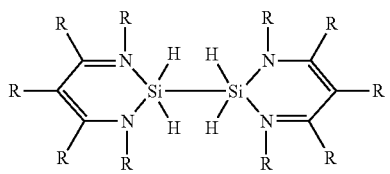

wherein each R is independently H, a C1 to C6 alkyl group, or a C3-C20 aryl or heterocycle group. Adjacent Rs may be joined to form cyclic chains.

Exemplary bis(β-diketiminate)disilanes include:

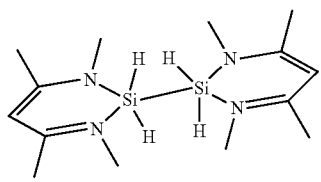

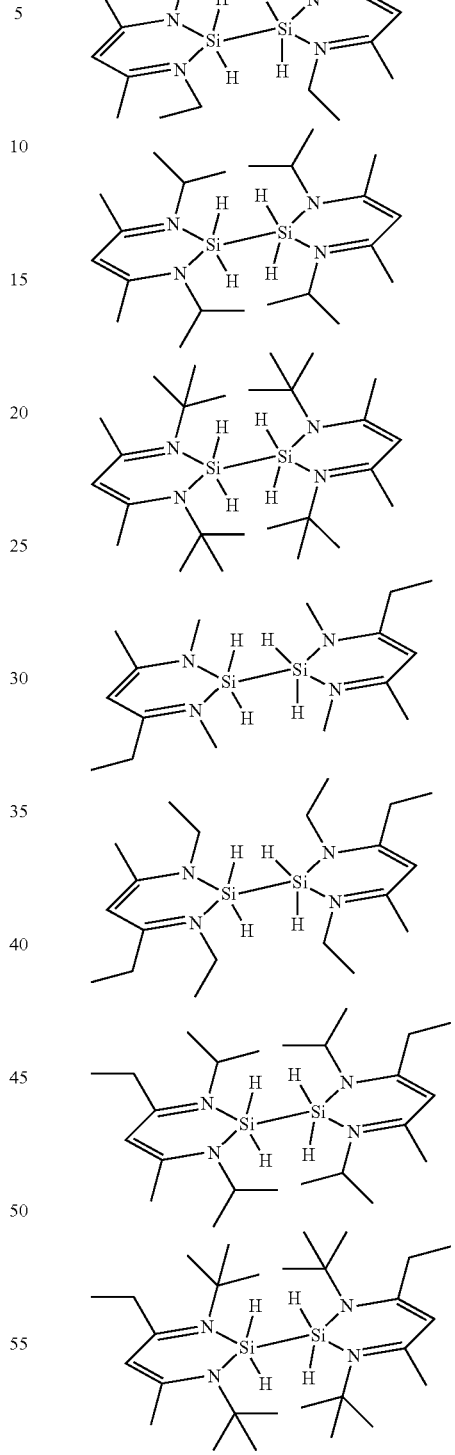

The $(RN=(CR)_n-NR)SiH_2-SiH_3$ or $[(RN=(CR)_n-NR)H_2Si-]_2$ precursors may be synthesized by combining a hydrocarbon solution of $SiXH_2SiH_3$ or $[-SiXH_2]_2$, respectively, wherein X is Cl, Br, I, or triflate ($SO_3CF_3$), with a neat or hydrocarbon solution of one (for the mono disilane) or two (for the bis disilane) equivalents of the ligand compound, such as $Li[RN-(CR)_n=NR]$, or two (for the mono disilane) or four (for the bis disilane) equivalents of the protonated ligand H(RN—(CR)$_n$=NR) under an inert atmosphere, such as nitrogen, the outlet of the mixing flask being connected to an oil bubbler to inhibit backflow of air and moisture. Alternatively, the disclosed (RN=(CR)$_n$—NR)SiH$_2$—SiH$_3$ or [(RN=(CR)$_n$—NR)H$_2$Si—]$_2$ precursors may be synthesized by reaction of Cl$_3$Si—SiCl$_3$ with one (mono) or two (bis) equivalents of the ligand compound Li[RN—(CR)$_n$=NR] or two (mono) or four (bis) equivalents of the ligand compound H[RN—(CR)$_n$=NR] followed by filtration and subsequent reduction using a selected metal hydride, such as LAH (lithium aluminum hydride). In all synthesis routes, the resulting solution may be stirred at room temperature overnight.

Exemplary hydrocarbon solutions suitable for these synthesis methods include diethyl ether, pentane, hexane, or toluene. The resulting suspension is filtered and the resulting solution distilled to remove solvent. Purification of the resulting liquid or solid is carried out by distillation or sublimation, respectively. Except for the ligand compounds Li[RN—(CR)$_n$=NR] all of the starting materials are commercially available. The ligand compound may be synthesized by combining a hydrocarbon solution of metalorganic salt (i.e., alkyl lithium) to a hydrocarbon solution of the appropriate amidine (for n=1) or β-diketimine (for n=3).

Each E may be an oxygen atom. Due to the increased oxygen content when compared to the N embodiments above, these molecules may be used to produce silicon-containing films that also contain oxygen, such as SiO$_2$, SiOC, or SiON, or to tune the amount of oxygen in a SiO$_2$, SiOC, or SiON containing film. The oxygen content may also make these precursors suitable for typical casting depositions conditions which may take place under a non-inert atmosphere.

One of ordinary skill in the art will recognize that embodiments in which n=1 may produce precursors having higher volatility and lower melting points, being more suitable for vapor deposition. Embodiments in which n=3 may also be suitable for vapor deposition when the resulting silicon-containing film also contains carbon. Embodiments in which n=3 may also be suitable for casting deposition methods, such as spin-on or dip coating.

Exemplary organodisilane precursors wherein x=3, n=1, and each E=O contain both acetate and hydride functionalities and have the following formula:

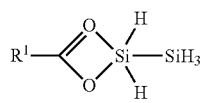

wherein R$^1$ is H, a C1 to C6 alkyl group, or a C3-C20 aryl or heterocycle group.

Exemplary mono(acetate)disilanes include:

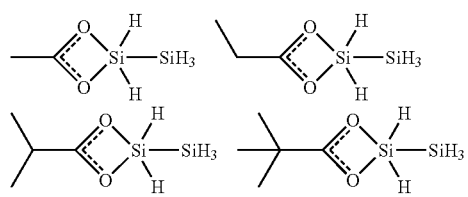

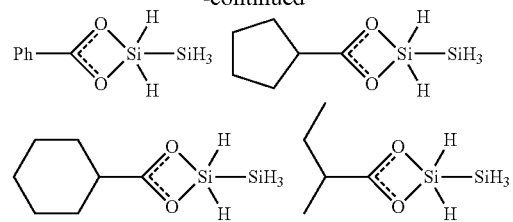

Exemplary organodisilane precursors wherein x=2, each n=1, and each E=O contain both acetate and hydride functionalities and have the following formula:

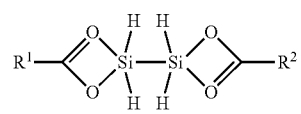

wherein R$^1$ and R$^2$ is independently H, a C1 to C6 alkyl group, or a C3-C20 aryl or heterocycle group.

Exemplary bis(acetate)disilanes include:

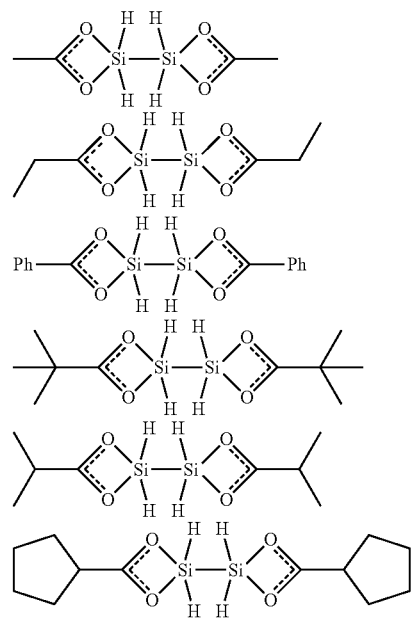

Exemplary organodisilane precursors wherein x=3, n=3, and each E is O contain both diketonate and hydride functionalities and have the following formula:

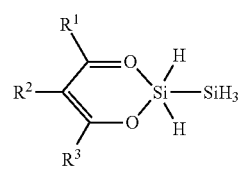

wherein R$^1$, R$^2$ and R$^3$ is independently H, a C1 to C6 alkyl group, or a C3-C20 aryl or heterocycle group. R$^1$ and R$^2$ and/or R$^2$ and R$^3$ may be joined to form cyclic chains.

Exemplary mono(β-diketonate)disilanes include:

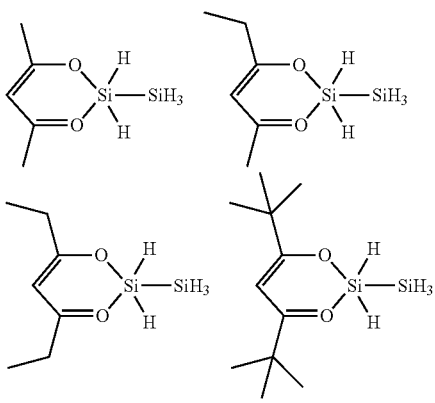

Exemplary organodisilane precursors wherein x=2, n=3, and each E is O contain both diketonate and hydride functionalities and have the following formula:

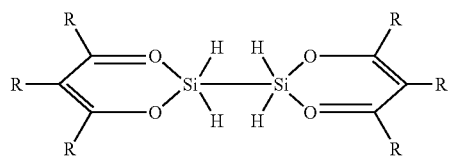

wherein each R is independently H, a C1 to C6 alkyl group, or a C3-C20 aryl or heterocycle group. Adjacent Rs may be joined to form cyclic chains.

Exemplary bis(β-diketonate)disilanes include:

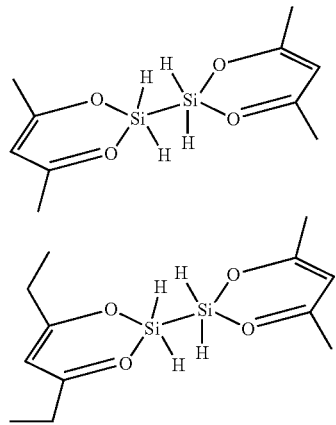

The (O—(CR)$_n$=O)SiH$_2$—SiH$_3$ or [(O—(CR)$_n$=O) H$_2$Si—]$_2$ precursors may be synthesized by combining a hydrocarbon solution of SiXH$_2$SiH$_3$ or [—SiXH$_2$]$_2$, respectively, wherein X is Cl, Br, I, or triflate (SO$_3$CF$_3$), with a neat or hydrocarbon solution of one (for the mono disilane) or two (for the bis disilane) equivalents of the ligand compound, such as Li[O—(CR)$_n$=O], or two (for the mono disilane) or four (for the bis disilane) equivalents of the protonated ligand H(O—(CR)$_n$=O) under an inert atmosphere, such as nitrogen, the outlet of the mixing flask being connected to an oil bubbler to inhibit backflow of air and moisture. Alternatively, the disclosed (O—(CR)$_n$=O) SiH$_2$—SiH$_3$ or [(O—(CR)$_n$=O)H$_2$Si—]$_2$ precursors may be synthesized by reaction of Cl$_3$Si—SiCl$_3$ with one (for the mono disilane) or two (for the bis disilane) equivalents of the ligand compound Li[O—(CR)$_n$=O] or two (for the mono disilane) or four (for the bis disilane) equivalents of the ligand compound H[O—(CR)$_n$=O] followed by filtration and subsequent reduction using a selected metal hydride, such as LAH (lithium aluminum hydride). In all synthesis routes, the resulting solution may be stirred at room temperature overnight.

Exemplary hydrocarbon solutions suitable for these synthesis methods include diethyl ether, pentane, hexane, or toluene. The resulting suspension is filtered and the resulting solution distilled to remove solvent. Purification of the resulting liquid or solid is carried out by distillation or sublimation, respectively. Except for the ligand compounds Li[O—(CR)$_n$=O] all of the starting materials are commercially available. The ligand compound may be synthesized by combining a hydrocarbon solution of metalorganic salt (i.e., alkyl lithium) to a hydrocarbon solution of the appropriate acetate, carboxylic acid or carbon dioxide (for n=1) or β-diketone (for n=3).

Each E may be a sulfur atom. The presence of sulfur within the precursor structure may improve the surface sticking coefficient thereby allowing for a favorable increase in film deposition rates.

One of ordinary skill in the art will recognize that embodiments in which n=1 may produce precursors having higher volatility and lower melting points, being more suitable for vapor deposition. Embodiments in which n=3 may also be suitable for vapor deposition when the resulting silicon-containing film also contains carbon. Embodiments in which n=3 may also be suitable for casting deposition methods, such as spin-on or dip coating.

Exemplary organodisilane precursors wherein x=3, n=1, and each E=S contain both dithiocarboxylate and hydride functionalities and have the following formula:

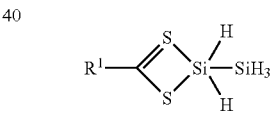

wherein R$^1$ is H, a C1 to C6 alkyl group, or a C3-C20 aryl or heterocycle group.

Exemplary mono(dithiocarboxylate)disilanes include:

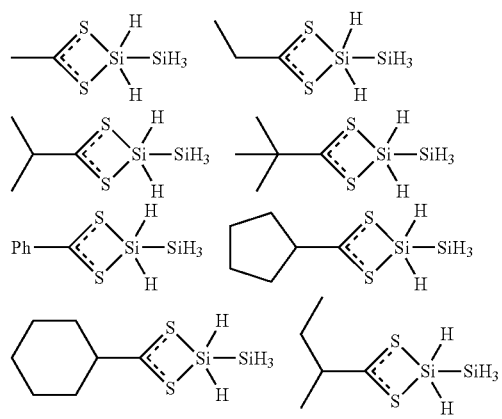

Exemplary organodisilane precursors wherein x=2, each n=1, and each E=S contain both dithiocarboxylate and hydride functionalities and have the following formula:

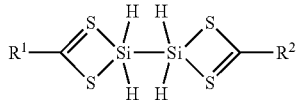

wherein R¹ and R² is independently H, a C1 to C6 alkyl group, or a C3-C20 aryl or heterocycle group.

Exemplary bis(dithiocarboxylate)disilanes include:

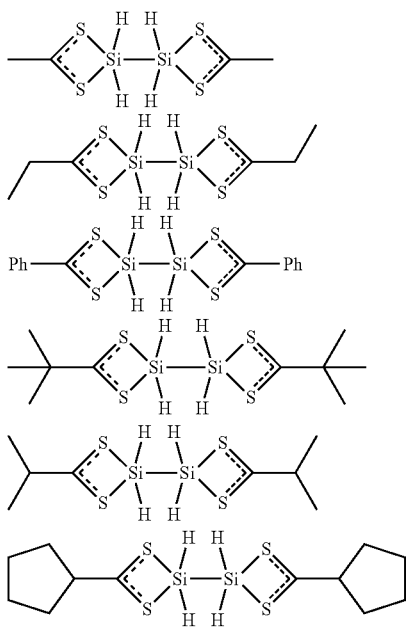

Exemplary organodisilane precursors wherein x=3, n=3, and each E is S contain both dithio-β-diketonate and hydride functionalities and have the following formula:

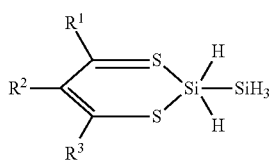

wherein R¹, R² and R³ is independently H, a C1 to C6 alkyl group, or a C3-C20 aryl or heterocycle group. R¹ and R² and/or R² and R³ may be joined to form cyclic chains.

Exemplary mono(dithio-3-diketonate)disilanes include:

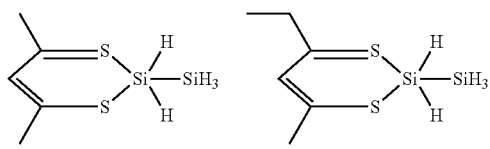

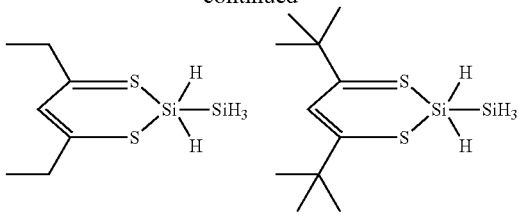

Exemplary organodisilane precursors wherein x=2, n=3, and each E is S contain both dithio-β-diketonate and hydride functionalities and have the following formula:

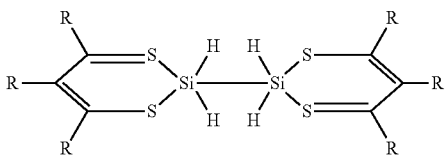

wherein each R is independently H, a C1 to C6 alkyl group, or a C3-C20 aryl or heterocycle group. Adjacent Rs may be joined to form cyclic chains.

Exemplary bis(dithio-β-diketonate)disilanes include:

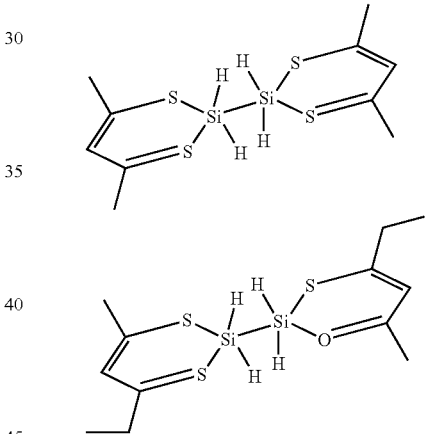

The $(S-(CR)_n=S)SiH_2-SiH_3$ or $[(S-(CR)_n=S)H_2Si-]_2$ precursors may be synthesized by combining a hydrocarbon solution of $SiXH_2SiH_3$ or $[-SiXH_2]_2$, respectively, wherein X is Cl, Br, I, or triflate ($SO_3CF_3$), with a neat or hydrocarbon solution of one (for the mono disilane) or two (for the bis disilane) equivalents of the ligand compound, such as $Li[S-(CR)_n=S]$, or two (for the monodisilane) or four (for the bis disilane) equivalents of the protonated ligand $H(S-(CR)_n=S)$ under an inert atmosphere, such as nitrogen, the outlet of the mixing flask being connected to an oil bubbler to inhibit backflow of air and moisture. Alternatively, the disclosed $(S-(CR)_n=S)SiH_2-SiH_3$ or $[(S-(CR)_n=S)H_2Si-]_2$ precursors may be synthesized by reaction of $Cl_3Si-SiCl_3$ with one (for the mono disilane) or two (for the bis disilane) equivalents of the ligand compound $Li[S-(CR)_n=S]$ or two (for the mono disilane) or four (for the bis disilane) equivalents of the ligand compound $H[S-(CR)_n=S]$ followed by filtration and subsequent reduction using a selected metal hydride such as LAH (lithium aluminum hydride). In all synthesis routes, the resulting solution may be stirred at room temperature overnight.

Exemplary hydrocarbon solutions suitable for these synthesis methods include diethyl ether, pentane, hexane, or toluene. The resulting suspension is filtered and the resulting solution distilled to remove solvent. Purification of the resulting liquid or solid is carried out by distillation or sublimation, respectively. Except for the ligand compounds Li[S—(CR)$_n$=S] all of the starting materials are commercially available. The ligand compound may be synthesized by combining a hydrocarbon solution of metalorganic salt (i.e., alkyl lithium) to a hydrocarbon solution of the appropriate dithiocarboxylate, dithiocarboxylic acid, or carbon disulfide (for n=1) or β-dithioketone (for n=3). The dithio-β-diketone (for n=3) may be synthesized by thiolation of the corresponding β-diketone using H$_2$S/I$_2$ (see Benvenuti et al, Applied Catalysis A, 199, 2000, 123-132). followed by combining a hydrocarbon solution of metalorganic salt (i.e., alkyl lithium) to a hydrocarbon solution of the resultant.

E may be both NR and oxygen atoms. Due to their increased nitrogen content when compared to the when every E is an oxygen atom, these molecules may be used to produce silicon-containing films that also contain nitrogen, such as SiN, SiCN, SiON, MSiN, or MSiON, wherein M is an element such as Hf, Zr, Ti, Nb, Ta, or Ge, or to tune the amount of nitrogen in those films.

One of ordinary skill in the art will recognize that embodiments in which n=1 may produce precursors having higher volatility and lower melting points, being more suitable for vapor deposition. Embodiments in which n=3 may also be suitable for vapor deposition when the resulting silicon-containing film also contains carbon. Embodiments in which n=3 may also be suitable for casting deposition methods, such as spin-on or dip coating.

Exemplary organodisilane precursors wherein x=3, n=1, one E is NR, and the other E is O contain both amidate and hydride functionalities and have the following formula:

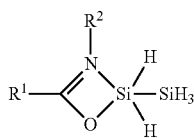

wherein R$^1$ and R$^2$ is independently H, a C1 to C6 alkyl group, or a C3-C20 aryl or heterocycle group. R$^1$ and R$^2$ may be joined to form cyclic chains.

Exemplary mono(amidate)disilanes include:

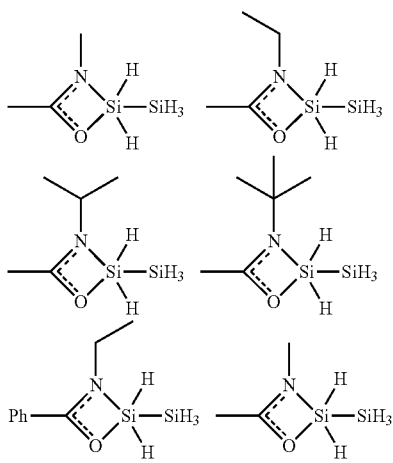

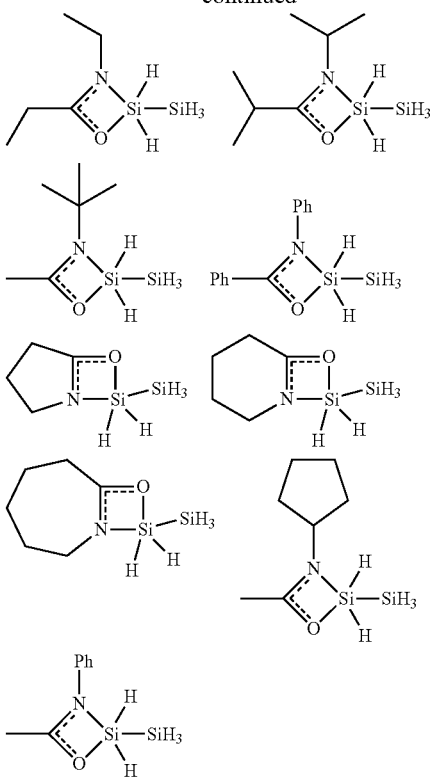

Exemplary organodisilane precursors wherein x=2, each n=1, one E is NR and one E is O on each (E-(CR)$_n$-E) ligand contain both ketoiminate and hydride functionalities and have the following formula:

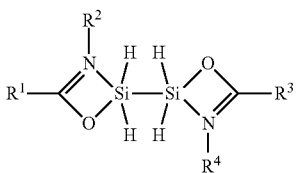

wherein R$^1$, R$^2$, R$^3$, and R$^4$ is independently H, a C1 to C6 alkyl group, or a C3-C20 aryl or heterocycle group. R$^1$ and R$^2$ and/or R$^3$ and R$^4$ may be joined to form cyclic chains.

Exemplary bis(amidate)disilanes include:

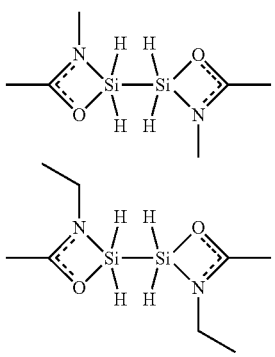

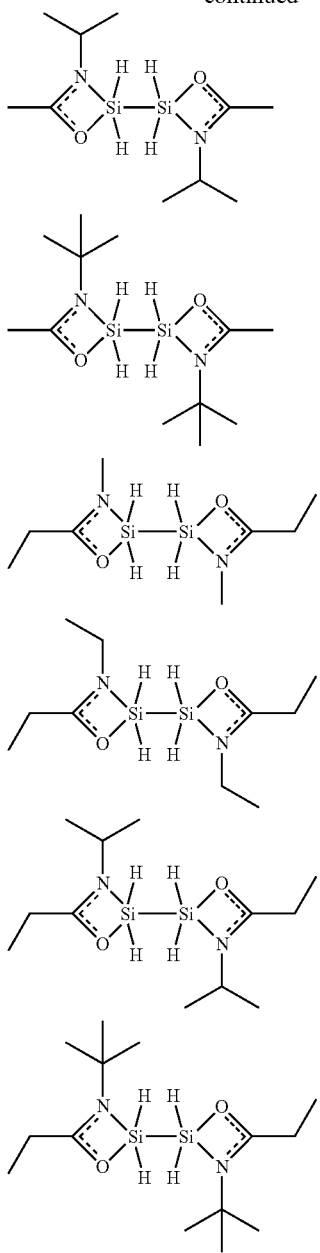

Exemplary organodisilane precursors wherein x=3, n=3, one E is NR and one E is O contain both β-ketiminate and hydride functionalities and have the following formula:

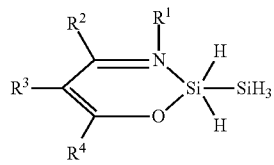

wherein $R^1$, $R^2$, $R^3$ and $R^4$ is independently H, a C1 to C6 alkyl group, or a C3-C20 aryl or heterocycle group. $R^1$ and $R^2$ and/or $R^2$ and $R^3$ and/or $R^3$ and $R^4$ may be joined to form cyclic chains.

Exemplary mono(β-ketiminate)disilanes include:

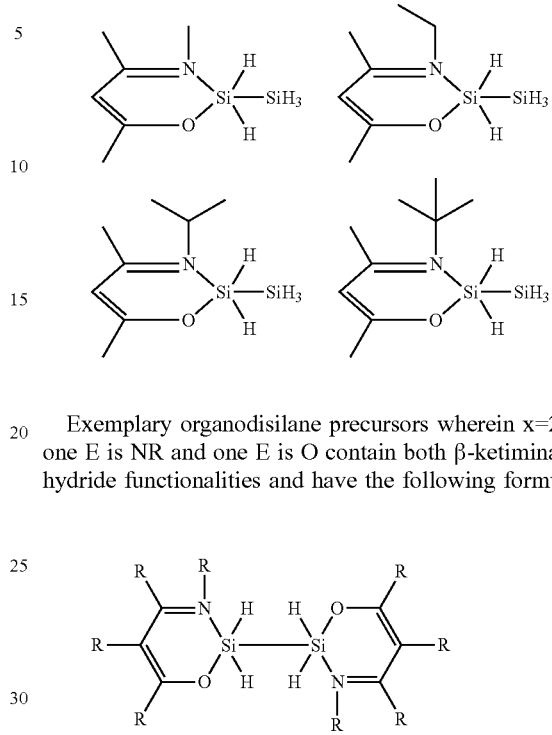

Exemplary organodisilane precursors wherein x=2, n=3, one E is NR and one E is O contain both β-ketiminate and hydride functionalities and have the following formula:

wherein $R^1$, $R^2$, $R^3$ and $R^4$ is independently H, a C1 to C6 alkyl group, or a C3-C20 aryl or heterocycle group. $R^1$ and $R^2$ and/or $R^2$ and $R^3$ and/or $R^3$ and $R^4$ may be joined to form cyclic chains.

Exemplary bis(β-ketiminate)disilanes include:

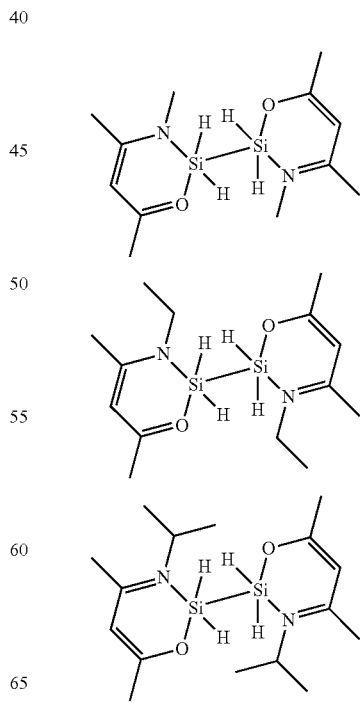

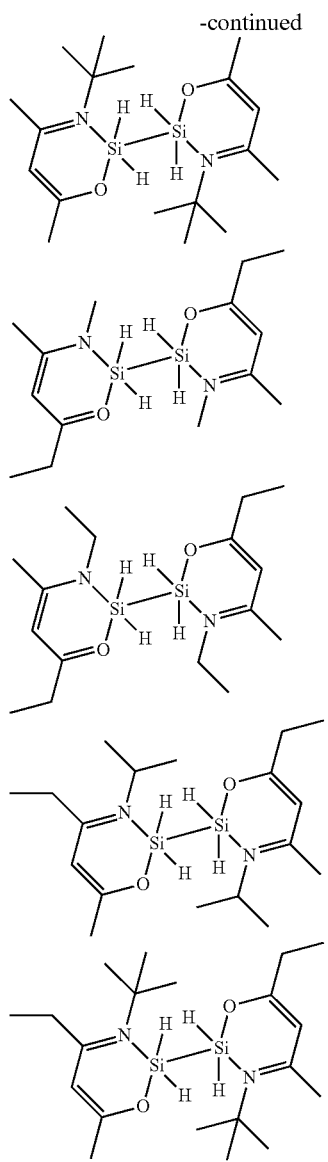

The (RN—(CR)$_n$=O)SiH$_2$—SiH$_3$ or [(RN—(CR)$_n$=O) H$_2$Si—]$_2$ precursors may be synthesized by combining a hydrocarbon solution of SiXH$_2$SiH$_3$ or [—SiXH$_2$]$_2$, respectively, wherein X is Cl, Br, I, or triflate (SO$_3$CF$_3$), with a neat or hydrocarbon solution of one (for the mono disilane) or two (for the bis disilane) equivalents of the ligand compound, such as Li[RN—(CR)$_n$=O], or two (for the mono disilane) or four (for the bis disilane) equivalents of the protonated ligand H(RN—(CR)$_n$=O) under an inert atmosphere, such as nitrogen, the outlet of the mixing flask being connected to an oil bubbler to inhibit backflow of air and moisture. Alternatively, the disclosed (RN—(CR)$_n$=O) SiH$_2$—SiH$_3$ or [(RN—(CR)$_n$=O)H$_2$Si—]$_2$ precursors may be synthesized by reaction of Cl$_3$Si—SiCl$_3$ with one (for the mono disilane) or two (for the bis disilane) equivalents of the ligand compound Li[RN—(CR)$_n$=O] or two (for the mono disilane) or four (for the bis disilane) equivalents of the ligand compound H[RN—(CR)$_n$=O] followed by filtration and subsequent reduction using a selected metal hydride, such as LAH (lithium aluminum hydride). In all synthesis routes, the resulting solution may be stirred at room temperature overnight.

Exemplary hydrocarbon solutions suitable for these synthesis methods include diethyl ether, pentane, hexane, or toluene. The resulting suspension is filtered and the resulting solution distilled to remove solvent. Purification of the resulting liquid or solid is carried out by distillation or sublimation, respectively. Except for the ligand compounds Li[RN—(CR)$_n$=O] all of the starting materials are commercially available. The ligand compound may be synthesized by combining a hydrocarbon solution of metalorganic salt (i.e., alkyl lithium) to a hydrocarbon solution of the appropriate amidate (for n=1) or β-ketimine (for n=3).

E may be both NR and sulfur atoms. The presence of sulfur within the precursor structure may improve the substrate sticking coefficient thereby allowing for a favorable increase in film deposition rates. Due to their increased nitrogen content when compared to the when every E is an oxygen atom, these molecules may be used to produce silicon-containing films that also contain nitrogen, such as SiN, SiCN, SiON, MSiN, or MSiON, wherein M is an element such as Hf, Zr, Ti, Nb, Ta, or Ge, or to tune the amount of nitrogen in those films.

One of ordinary skill in the art will recognize that embodiments in which n=1 may produce precursors having higher volatility and lower melting points, being more suitable for vapor deposition. Embodiments in which n=3 may also be suitable for vapor deposition when the resulting silicon-containing film also contains carbon. Embodiments in which n=3 may also be suitable for casting deposition methods, such as spin-on or dip coating.

Exemplary organodisilane precursors wherein x=3, n=1, one E is NR, and one E is S contain both thioamidate and hydride functionalities and have the following formula:

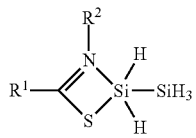

wherein R$^1$ and R$^2$ is independently H, a C1 to C6 alkyl group, or a C3-C20 aryl or heterocycle group. R$^1$ and R$^2$ may be joined to form cyclic chains.

Exemplary mono(thioamidate)disilanes include:

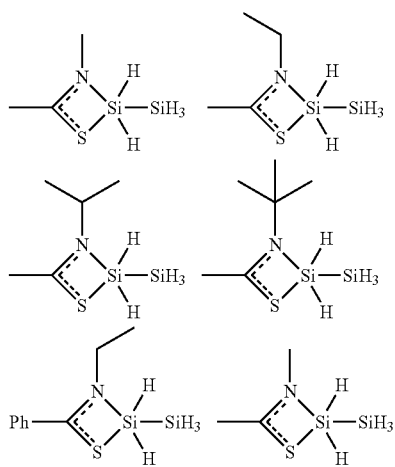

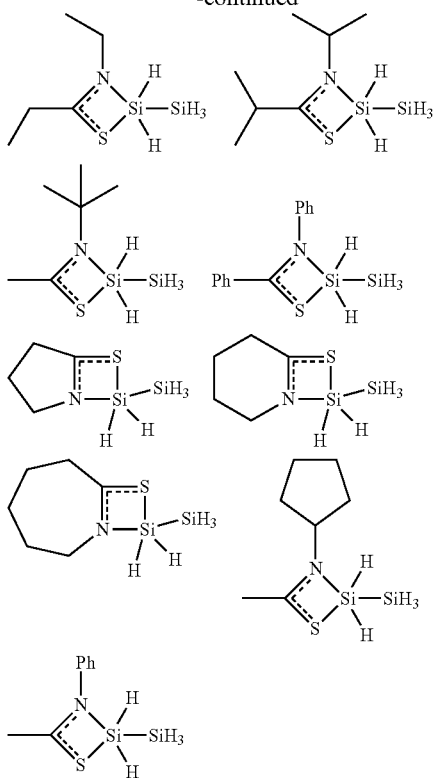

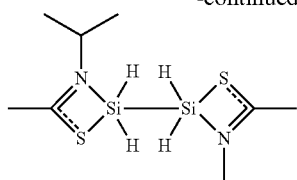

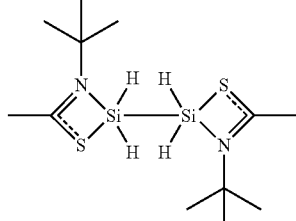

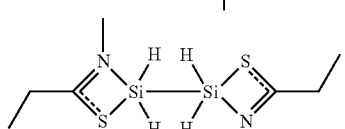

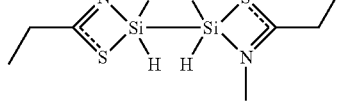

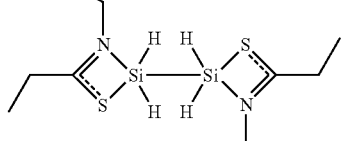

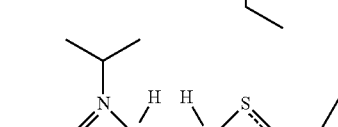

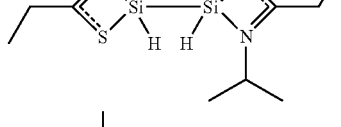

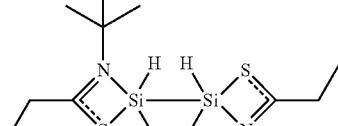

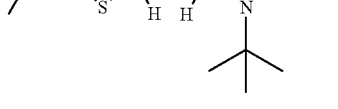

Exemplary organodisilane precursors wherein x=2, n=1, one E is NR and one E is S on each (E-(CR)$_n$-E) ligand contain both thioamidate and hydride functionalities and have the following formula:

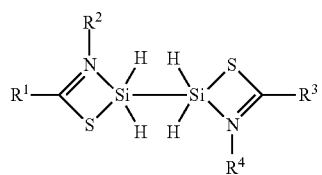

wherein $R^1$, $R^2$, $R^3$, and $R^4$ is independently H, a C1 to C6 alkyl group, or a C3-C20 aryl or heterocycle group. $R^1$ and $R^2$ and/or $R^3$ and $R^4$ may be joined to form cyclic chains.

Exemplary bis(thioamidate)disilanes include:

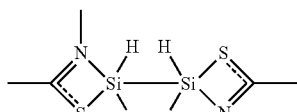

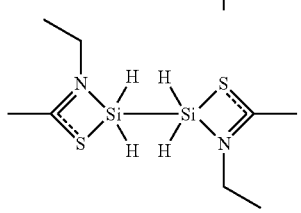

Exemplary organodisilane precursors wherein x=3, n=3, one E is NR and one E is S contain both β-thioketiminate and hydride functionalities and have the following formula:

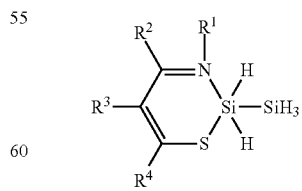

wherein $R^1$, $R^2$, $R^3$ and $R^4$ is independently H, a C1 to C6 alkyl group, or a C3-C20 aryl or heterocycle group. $R^1$ and $R^2$ and/or $R^2$ and $R^3$ and/or $R^3$ and $R^4$ may be joined to form cyclic chains.

Exemplary mono(β-thioketiminate)disilanes include:

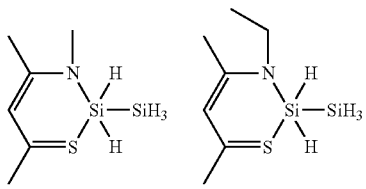

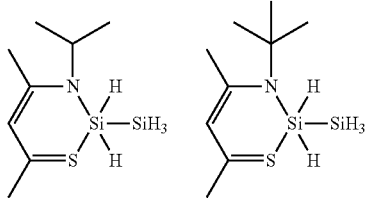

Exemplary organodisilane precursors wherein x=2, n=3, one E is NR and one E is S contain both β-thioketiminate and hydride functionalities and have the following formula:

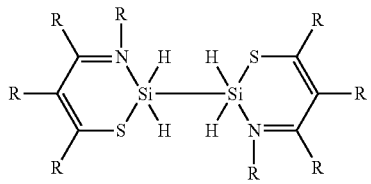

wherein each R is independently H, a C1 to C6 alkyl group, or a C3-C20 aryl or heterocycle group. Adjacent Rs may be joined to form cyclic chains.

Exemplary bis(β-thioketiminate)disilanes include:

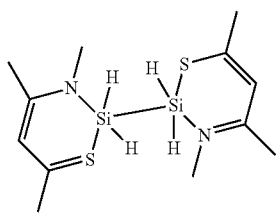

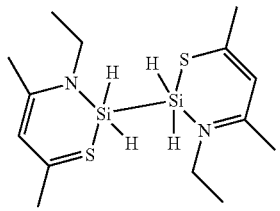

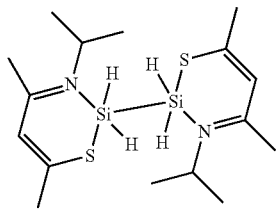

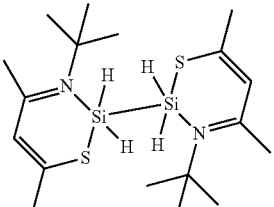

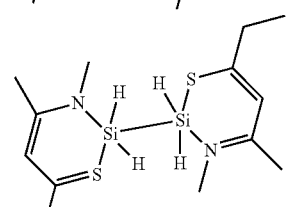

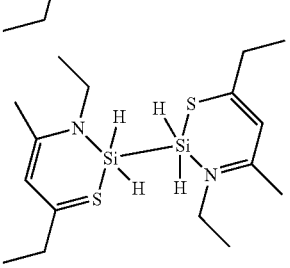

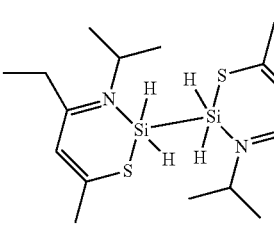

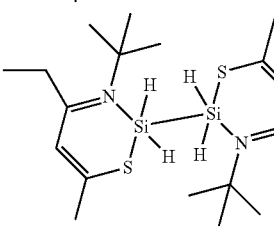

The (RN—(CR)$_n$=S)SiH$_2$—SiH$_3$ or [(RN—(CR)$_n$=S)H$_2$Si—]$_2$ precursors may be synthesized by combining a hydrocarbon solution of SiXH$_2$SiH$_3$ or [—SiXH$_2$]$_2$, respectively, wherein X is Cl, Br, I, or triflate (SO$_3$CF$_3$), with a neat or hydrocarbon solution of one (for the mono disilane) or two (for the bis disilane) equivalents of the ligand compound, such as Li[RN—(CR)$_n$=S], or two (for the mono disilane) or four (for the bis disilane) equivalents of the protonated ligand H(RN—(CR)$_n$=S) under an inert atmosphere, such as nitrogen, the outlet of the mixing flask being connected to an oil bubbler to inhibit backflow of air and moisture. Alternatively, the disclosed (RN—(CR)$_n$=S)SiH$_2$—SiH$_3$ or [(RN—(CR)$_n$=S)H$_2$Si—]$_2$ precursors may be synthesized by reaction of Cl$_3$Si—SiCl$_3$ with one (for the mono disilane) or two (for the bis disilane) equivalents of the ligand compound Li[RN—(CR)$_n$=S] or two (for the mono disilane) or four (for the bis disilane) equivalents of the ligand compound H[RN—(CR)$_n$=S] followed by filtration and subsequent reduction using a selected metal hydride such as LAH (lithium aluminum hydride). In all synthesis routes, the resulting solution may be stirred at room temperature overnight.

Exemplary hydrocarbon solutions suitable for these synthesis methods include diethyl ether, pentane, hexane, or toluene. The resulting suspension is filtered and the resulting solution distilled to remove solvent. Purification of the resulting liquid or solid is carried out by distillation or sublimation, respectively. Except for the ligand compounds Li[RN—(CR)$_n$=S] all of the starting materials are commercially available. The ligand compound for n=1 may be synthesized by combining a hydrocarbon solution of metalorganic salt (i.e., alkyl lithium) to a hydrocarbon solution of the appropriate thioamide. The ligand compound for n=3 may be synthesized by thiolation of the corresponding β-ketimine using H$_2$S/I$_2$ (see Benvenuti et al, Applied Catalysis A, 199, 2000, 123-132) followed by combining a hydrocarbon solution of metalorganic salt (i.e., alkyl lithium) to a hydrocarbon solution of the resultant β-thioketimine.

E may be both oxygen and sulfur atoms. The presence of sulfur within the precursor structure may improve the substrate sticking coefficient thereby allowing for a favorable increase in film deposition rates. The oxygen content may result in silicon-containing films that also contain oxygen, such as SiO$_2$, SiOC, or SiON, or to tune the amount of oxygen in a SiO$_2$, SiOC, or SiON containing film.

One of ordinary skill in the art will recognize that embodiments in which n=1 may produce precursors having higher volatility and lower melting points, being more suitable for vapor deposition. Embodiments in which n=3 may also be suitable for vapor deposition when the resulting silicon-containing film also contains carbon. Embodiments in which n=3 may also be suitable for casting deposition methods, such as spin-on or dip coating.

Exemplary organodisilane precursors wherein x=3, n=1, one E is O, and one E is S contain both thiocarboxylate and hydride functionalities and have the following formula:

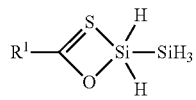

wherein R$^1$ is H, a C1 to C6 alkyl group, or a C3-C20 aryl or heterocycle group.

Exemplary mono(thiocarboxylate)disilanes include:

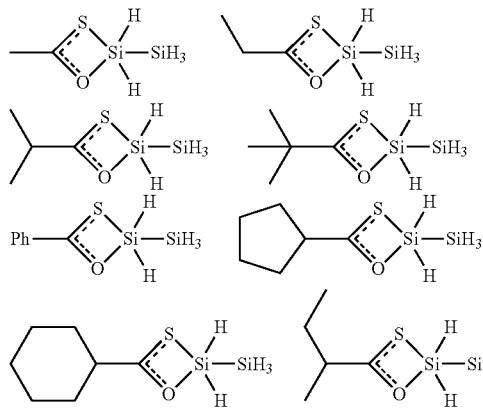

Exemplary organodisilane precursors wherein x=2, each n=1, one E is O, and one E is S on each (E-(CR)$_n$-E) ligand contain both thiocarboxylate and hydride functionalities and have the following formula:

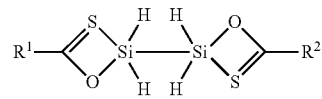

wherein R$^1$ and R$^2$ is independently H, a C1 to C6 alkyl group, or a C3-C20 aryl or heterocycle group.

Exemplary bis(thiocarboxylate)disilanes include:

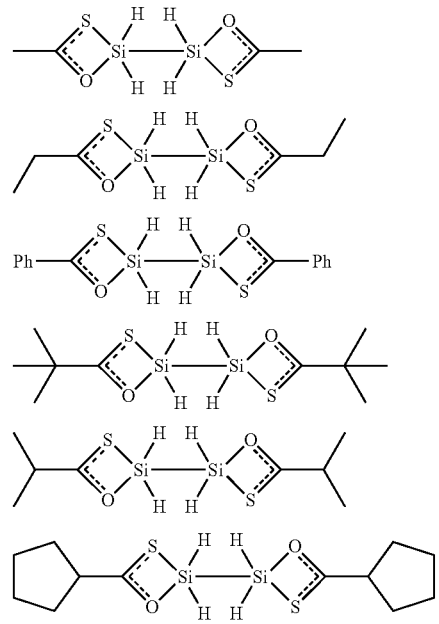

Exemplary organodisilane precursors wherein x=3, n=3, one E is O and one E is S contain both β-thioketonate and hydride functionalities and have the following formula:

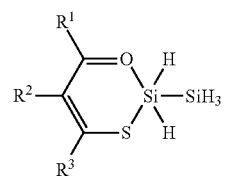

wherein R$^1$, R$^2$ and R$^3$ is independently H, a C1 to C6 alkyl group, or a C3-C20 aryl or heterocycle group. R$^1$ and R$^2$ and/or R$^2$ and R$^3$ may be joined to form cyclic chains.

Exemplary mono(β-thioketonate)disilanes include:

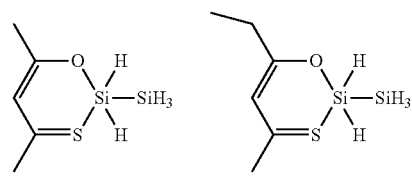

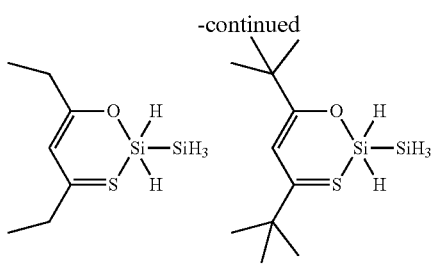

Exemplary organodisilane precursors wherein x=2, n=3, one E is O and one E is S contain both β-thioketonate and hydride functionalities and have the following formula:

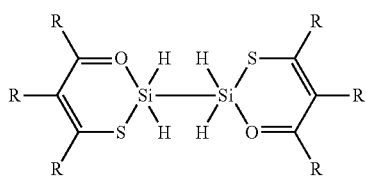

wherein each R is independently H, a C1 to C6 alkyl group, or a C3-C20 aryl or heterocycle group. Adjacent Rs may be joined to form cyclic chains.

Exemplary bis(β-thioketonate)disilanes include:

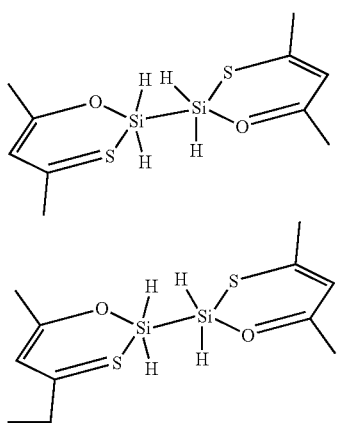

The $(O-(CR)_n=S)SiH_2-SiH_3$ or $[(O-(CR)_n=S)H_2Si-]_2$ precursors may be synthesized by combining a hydrocarbon solution of $SiXH_2SiH_3$ or $[-SiXH_2]_2$, respectively, wherein X is Cl, Br, I, or triflate ($SO_3CF_3$), with a neat or hydrocarbon solution of one (for the mono disilane) or two (for the bis disilane) equivalents of the ligand compound, such as $Li[O-(CR)_n=S]$, or two (for the mono disilane) or four (for the bis disilane) equivalents of the protonated ligand $H(O-(CR)_n=S)$ under an inert atmosphere, such as nitrogen, the outlet of the mixing flask being connected to an oil bubbler to inhibit backflow of air and moisture. Alternatively, the disclosed $(O-(CR)_n=S)SiH_2-SiH_3$ or $[(O-(CR)_n=S)H_2Si-]_2$ precursors may be synthesized by reaction of $Cl_3Si-SiCl_3$ with one (for the mono disilane) or two (for the bis disilane) equivalents of the ligand compound $Li[O-(CR)_n=S]$ or two (for the mono disilane) or four (for the bis disilane) equivalents of the ligand compound $H[O-(CR)_n=S]$ followed by filtration and subsequent reduction using a selected metal hydride, such as LAH (lithium aluminum hydride). In all synthesis routes, the resulting solution may be stirred at room temperature overnight.

Exemplary hydrocarbon solutions suitable for these synthesis methods include diethyl ether, pentane, hexane, or toluene. The resulting suspension is filtered and the resulting solution distilled to remove solvent. Purification of the resulting liquid or solid is carried out by distillation or sublimation, respectively. Except for the ligand compounds $Li[O-(CR)_n=S]$ all of the starting materials are commercially available. The ligand compound for n=1 may be synthesized by combining a hydrocarbon solution of metalorganic salt (i.e., alkyl lithium) to a hydrocarbon solution of the appropriate thiocarboxylate, thiocarboxylic acid, or carbonyl sulfide. The ligand compound for n=3 may be synthesized by thiolation of the corresponding β-diketone using $H_2S/I_2$ (see Benvenuti et al, Applied Catalysis A, 199, 2000, 123-132) followed by combining a hydrocarbon solution of metalorganic salt (i.e., alkyl lithium) to a hydrocarbon solution of the resultant β-thioketimine.

To ensure process reliability, the resulting Si-containing film forming composition may be purified by continuous or fractional batch distillation or sublimation prior to comprise between approximately 90% w/w to approximately 100% w/w of the organodisilane precursor, and preferably between approximately 99% w/w to approximately 100% w/w. The Si-containing film forming compositions may contain any of the following impurities: undesired congeneric species; solvents; chlorinated metal compounds; or other reaction products. Preferably, the total quantity of these impurities is below approximately 0.1% w/w.

The concentration of each of hexane, substituted hexane, pentane, substituted pentane, dimethoxy ether, or anisole in the purified material may range from approximately 0% w/w to approximately 5% w/w, preferably from approximately 0% w/w to approximately 0.1% w/w. Solvents may be used in the composition's synthesis. Separation of the solvents from the composition may be difficult if both have similar boiling points. Cooling the mixture may produce solid precursor in liquid solvent, which may be separated by filtration. Vacuum distillation may also be used, provided the precursor product is not heated above approximately its decomposition point.

In one embodiment the disclosed Si-containing film forming composition contains between approximately 0% v/v and approximately 5% v/v, preferably less than approximately 1% v/v, more preferably less than approximately 0.1% v/v, and even more preferably less than approximately 0.01% v/v of any of its undesired congeneric species, reactants, or other reaction products. This embodiment may provide better process repeatability. This embodiment may be produced by distillation or sublimation of the Si-containing film forming composition. In an alternate embodiment, the disclosed Si-containing film forming compositions may contain between approximately 5% v/v and approximately 50% v/v of the organodisilane precursor, particularly when the mixture provides improved process parameters or isolation of the target precursor is too difficult or expensive. For example, a mixture of organodisilane precursors may produce a stable, liquid mixture suitable for spin-on or vapor deposition.

The concentration of trace metals and metalloids in the Si-containing film forming composition may each range from approximately 0 ppb to approximately 100 ppb, and more preferably from approximately 0 ppb to approximately 10 ppb. The concentration of X (wherein X=Cl, Br, I, or F) in the purified Si-containing film forming composition may range from approximately 0 ppm to approximately 100 ppm and more preferably from approximately 0 ppm to approximately 10 ppm.

Figure 2:
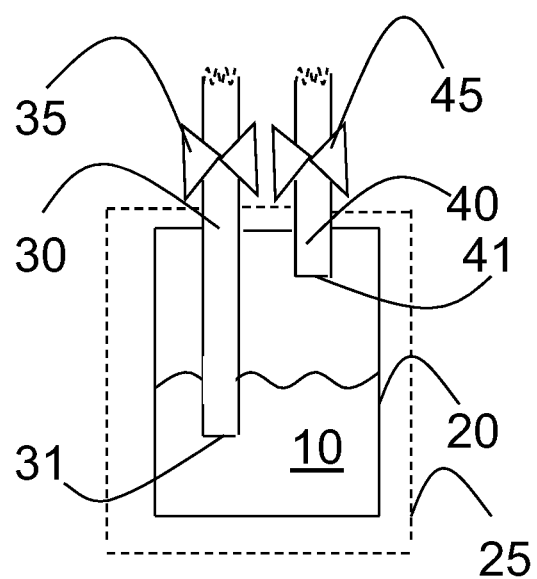
FIG. 2 is a side view of a second embodiment of the Si-containing film forming delivery device disclosed herein.

The Si-containing film forming compositions may be delivered to a semiconductor processing tool by the disclosed Si-containing film forming composition delivery devices. FIGS. 1 and 2 show two embodiments of the disclosed delivery devices 1.

FIG. 1 is a side view of one embodiment of the Si-containing film forming composition delivery device 1. In FIG. 1, the disclosed Si-containing film forming compositions 10 are contained within a container 20 having two conduits, an inlet conduit 30 and an outlet conduit 40. One of ordinary skill in the precursor art will recognize that the container 20, inlet conduit 30, and outlet conduit 40 are manufactured to prevent the escape of the gaseous form of the Si-containing film forming composition 10, even at elevated temperature and pressure.

For pyrophoric compositions, such as $SiH_3$—$SiH_2$—$^{iPr}$N-amd, the delivery device must be leak tight and be equipped with valves that do not permit even minute amounts of the material. Suitable valves include spring-loaded or tied diaphragm valves. The valve may further comprise a restrictive flow orifice (RFO). The delivery device should be connected to a gas manifold and in an enclosure. The gas manifold should permit the safe evacuation and purging of the piping that may be exposed to Air when the delivery device is replaced so that any residual amounts of the pyrophoric material does not react. The enclosure should be equipped with sensors and fire control capability to control the fire in the case of a pyrophoric material release. The gas manifold should also be equipped with isolation valves, vacuum generators, and permit the introduction of a purge gas at a minimum.

The delivery device fluidly connects to other components of the semiconductor processing tool, such as the gas cabinet disclosed above, via valves 35 and 45. Preferably, the delivery device 20, inlet conduit 30, valve 35, outlet conduit 40, and valve 45 are made of 316L EP or 304 stainless steel.

However, one of ordinary skill in the art will recognize that other non-reactive materials may also be used in the teachings herein and that any corrosive Si-containing film forming compositions 10 may require the use of more corrosion-resistant materials, such as Hastelloy or Inconel.

In FIG. 1, the end 31 of inlet conduit 30 is located above the surface 11 of the Si-containing film forming composition 10, whereas the end 41 of the outlet conduit 40 is located below the surface 11 of the Si-containing film forming composition 10. In this embodiment, the Si-containing film forming composition 10 is preferably in liquid form. An inert gas, including but not limited to nitrogen, argon, helium, and mixtures thereof, may be introduced into the inlet conduit 30. The inert gas pressurizes the delivery device 20 so that the liquid Si-containing film forming composition 10 is forced through the outlet conduit 40 and to components in the semiconductor processing tool (not shown). The semiconductor processing tool may include a vaporizer which transforms the liquid Si-containing film forming composition 10 into a vapor, with or without the use of a carrier gas such as helium, argon, nitrogen or mixtures thereof, in order to deliver the vapor to a chamber where a wafer to be repaired is located and treatment occurs in the vapor phase. Alternatively, the liquid Si-containing film forming composition 10 may be delivered directly to the wafer surface as a jet or aerosol.

FIG. 2 is a side view of a second embodiment of the Si-containing film forming composition delivery device 1.

In FIG. 2, the end 31 of inlet conduit 30 is located below the surface 11 of the Si-containing film forming composition 10, whereas the end 41 of the outlet conduit 40 is located above the surface 11 of the Si-containing film forming composition 10. FIG. 2, also includes an optional heating element 25, which may increase the temperature of the Si-containing film forming composition 10. In this embodiment, the Si-containing film forming composition 10 may be in solid or liquid form. An inert gas, including but not limited to nitrogen, argon, helium, and mixtures thereof, is introduced into the inlet conduit 30. The inert gas bubbles through the Si-containing film forming composition 10 and carries a mixture of the inert gas and vaporized Si-containing film forming composition 10 to the outlet conduit 40 and on to the components in the semiconductor processing tool.

Both FIGS. 1 and 2 include valves 35 and 45. One of ordinary skill in the art will recognize that valves 35 and 45 may be placed in an open or closed position to allow flow through conduits 30 and 40, respectively. Either delivery device 1 in FIG. 1 or 2, or a simpler delivery device having a single conduit terminating above the surface of any solid or liquid present, may be used if the Si-containing film forming composition 10 is in vapor form or if sufficient vapor pressure is present above the solid/liquid phase. In this case, the Si-containing film forming composition 10 is delivered in vapor form through the conduit 30 or 40 simply by opening the valve 35 in FIG. 1 or 45 in FIG. 2, respectively. The delivery device 1 may be maintained at a suitable temperature to provide sufficient vapor pressure for the Si-containing film forming composition 10 to be delivered in vapor form, for example by the use of an optional heating element 25.

While FIGS. 1 and 2 disclose two embodiments of the Si-containing film forming composition delivery device 1, one of ordinary skill in the art will recognize that the inlet conduit 30 and outlet conduit 40 may both be located above or below the surface 11 of the Si-containing film forming composition 10 without departing from the disclosure herein. Furthermore, inlet conduit 30 may be a filling port. Finally, one of ordinary skill in the art will recognize that the disclosed Si-containing film forming composition may be delivered to semiconductor processing tools using other delivery devices, such as the ampoules disclosed in WO 2006/059187 to Jurcik et al., without departing from the teachings herein.

Also disclosed are methods of using the disclosed Si-containing film forming compositions for vapor deposition methods. The disclosed methods provide for the use of the Si-containing film forming composition for deposition of silicon-containing films. The disclosed methods may be useful in the manufacture of semiconductor, photovoltaic, LCD-TFT, or flat panel type devices. The method includes: providing a substrate; providing a vapor including at least one of the disclosed Si-containing film forming compositions: and contacting the vapor with the substrate (and typically directing the vapor to the substrate) to form a silicon-containing layer on at least one surface of the substrate.

The disclosed methods also provide for forming a bimetal-containing layer on a substrate using a vapor deposition process and, more particularly, for deposition of $SiMO_x$ films wherein x is 4 and M is Ta, Hf, Nb, Mg, Al, Sr, Y, Ba, Ca, As, Sb, Bi, Sn, Pb, Co, lanthanides (such as Er), or combinations thereof. The disclosed methods may be useful in the manufacture of semiconductor, photovoltaic, LCD-TFT, or flat panel type devices. The method includes: providing a substrate; providing a vapor including at least one of the disclosed Si-containing film forming compositions and contacting the vapor with the substrate (and typically directing the vapor to the substrate) to form a bi metal-containing layer on at least one surface of the substrate. An oxygen source, such as $O_3$, $O_2$, $H_2O$, NO, $H_2O_2$, acetic acid, formalin, para-formaldehyde, oxygen radicals thereof, and combinations thereof, but preferably $O_3$ or plasma treated $O_2$ may also be provided with the vapor.

The disclosed Si-containing film forming compositions may deposit Si-containing films using any vapor deposition methods known in the art. Examples of suitable vapor deposition methods include chemical vapor deposition (CVD) or atomic layer deposition (ALD). Exemplary CVD methods include thermal CVD, plasma enhanced CVD (PECVD), pulsed CVD (PCVD), low pressure CVD (LP-CVD), sub-atmospheric CVD (SACVD) or atmospheric pressure CVD (APCVD), flowable CVD (f-CVD), hot-wire CVD (HWCVD, also known as cat-CVD, in which a hot wire serves as an energy source for the deposition process), radicals incorporated CVD, and combinations thereof. Exemplary ALD methods include thermal ALD, plasma enhanced ALD (PEALD), spatial isolation ALD, hot-wire ALD (HWALD), radicals incorporated ALD, and combinations thereof. Super critical fluid deposition may also be used. The deposition method is preferably ALD, spatial ALD, or PE-ALD in order to provide suitable step coverage and film thickness control.

The vapor of the Si-containing film forming composition is introduced into a reaction chamber containing at least one substrate. The temperature and the pressure within the reaction chamber and the temperature of the substrate are held at conditions suitable for vapor deposition of at least part of the organodisilane precursor onto the substrate. In other words, after introduction of the vaporized composition into the chamber, conditions within the chamber are such that at least part of the precursor is deposited onto the substrate to form the silicon-containing film. A reactant may also be used to help in formation of the Si-containing layer.

The reaction chamber may be any enclosure or chamber of a device in which deposition methods take place, such as, without limitation, a parallel-plate type reactor, a cold-wall type reactor, a hot-wall type reactor, a single-wafer reactor, a multi-wafer reactor, or other such types of deposition systems. All of these exemplary reaction chambers are capable of serving as an ALD reaction chamber. The reaction chamber may be maintained at a pressure ranging from about 0.5 mTorr to about 20 Torr. In addition, the temperature within the reaction chamber may range from about 20° C. to about 600° C. One of ordinary skill in the art will recognize that the temperature may be optimized through mere experimentation to achieve the desired result.

The temperature of the reactor may be controlled by either controlling the temperature of the substrate holder or controlling the temperature of the reactor wall. Devices used to heat the substrate are known in the art. The reactor wall is heated to a sufficient temperature to obtain the desired film at a sufficient growth rate and with desired physical state and composition. A non-limiting exemplary temperature range to which the reactor wall may be heated includes from approximately 20° C. to approximately 600° C. When a plasma deposition process is utilized, the deposition temperature may range from approximately 20° C. to approximately 550° C. Alternatively, when a thermal process is performed, the deposition temperature may range from approximately 300° C. to approximately 600° C.

Alternatively, the substrate may be heated to a sufficient temperature to obtain the desired silicon-containing film at a sufficient growth rate and with desired physical state and composition. A non-limiting exemplary temperature range to which the substrate may be heated includes from 150° C. to 600° C. Preferably, the temperature of the substrate remains less than or equal to 500° C.

The type of substrate upon which the silicon-containing film will be deposited will vary depending on the final use intended. In some embodiments, the substrate may be a patterned photoresist film made of hydrogenated carbon, for example $CH_x$, wherein x is greater than zero. In some embodiments, the substrate may be chosen from oxides which are used as dielectric materials in MIM, DRAM, or FeRam technologies (for example, $ZrO_2$ based materials, $HfO_2$ based materials, $TiO_2$ based materials, rare earth oxide based materials, ternary oxide based materials, etc.) or from nitride-based films (for example, TaN) that are used as an oxygen barrier between copper and the low-k layer. Other substrates may be used in the manufacture of semiconductors, photovoltaics, LCD-TFT, or flat panel devices. Examples of such substrates include, but are not limited to, solid substrates such as metal nitride containing substrates (for example, TaN, TiN, WN, TaCN, TiCN, TaSiN, and TiSiN); insulators (for example, $SiO_2$, $Si_3N_4$, SiON, $HfO_2$, $Ta_2O_5$, $ZrO_2$, $TiO_2$, $Al_2O_3$, and barium strontium titanate); or other substrates that include any number of combinations of these materials. The actual substrate utilized may also depend upon the specific precursor embodiment utilized. In many instances though, the preferred substrate utilized will be selected from hydrogenated carbon, TiN, SRO, Ru, and Si type substrates, such as polysilicon or crystalline silicon substrates.

The substrate may be patterned to include vias or trenches having high aspect ratios. For example, a conformal Si-containing film, such as $SiO_2$, may be deposited using any ALD technique on a through silicon via (TSV) having an aspect ratio ranging from approximately 20:1 to approximately 100:1.

The Si-containing film forming compositions may be supplied either in neat form or in a blend with a solvent suitable for vapor deposition, such as toluene, ethyl benzene, xylene, mesitylene, decane, dodecane, octane, hexane, pentane, tertiary amines, acetone, tetrahydrofuran, ethanol, ethylmethylketone, 1,4-dioxane, or others. Alternatively, the Si-containing film forming composition may comprise a solvent suitable for casting deposition, such as naphtha, methylisobutylketone (MIBK), n-methylisobutylketone (NMIBK), or combinations thereof. One of ordinary skill in the art will recognize that the casting deposition solution may further comprise pH regulators or surfactants. The disclosed precursors may be present in varying concentrations in the solvent. For example, the resulting concentration of the vapor deposition solution may range from approximately 0.01 M to approximately 2 M. One of ordinary skill in the art will recognize that the molarity of the casting deposition solution is directly proportional to the desired film thickness and may adjust the molarity accordingly.

For vapor deposition, the neat or blended organodisilane precursors are introduced into a reactor in vapor form by conventional means, such as tubing and/or flow meters. The precursor in vapor form may be produced by vaporizing the neat or blended precursor solution through a conventional vaporization step such as direct vaporization, distillation, by bubbling, or by using a sublimator such as the one disclosed in PCT Publication WO2009/087609 to Xu et al. The neat or blended precursor may be fed in liquid state to a vaporizer where it is vaporized before it is introduced into the reactor. Alternatively, the neat or blended precursor may be vaporized by passing a carrier gas into a container containing the precursor or by bubbling of the carrier gas into the precursor. The carrier gas may include, but is not limited to, Ar, He, or $N_2$, and mixtures thereof. Bubbling with a carrier gas may also remove any dissolved oxygen present in the neat or blended precursor solution. The carrier gas and precursor are then introduced into the reactor as a vapor.

If necessary, the container may be heated to a temperature that permits the Si-containing film forming composition to be in its liquid phase and to have a sufficient vapor pressure. The container may be maintained at temperatures in the range of, for example, 0-150° C. Those skilled in the art recognize that the temperature of the container may be adjusted in a known manner to control the amount of Si-containing film forming composition vaporized.

In addition to the disclosed precursor, a reaction gas may also be introduced into the reactor. The reaction gas may be an oxidizing agent such as one of $O_2$; $O_3$; $H_2O$; $H_2O_2$; oxygen containing radicals such as O. or OH.; NO; $NO_2$; carboxylic acids such as formic acid, acetic acid, propionic acid; radical species of NO, $NO_2$, or the carboxylic acids; para-formaldehyde; and mixtures thereof. Preferably, the oxidizing agent is selected from the group consisting of $O_2$, $O_3$, $H_2O$, $H_2O_2$, oxygen containing radicals thereof such as O. or OH., and mixtures thereof. Preferably, when an ALD process is performed, the reactant is plasma treated oxygen, ozone, or combinations thereof. When an oxidizing gas is used, the resulting silicon containing film will also contain oxygen.

Alternatively, the reaction gas may be a reducing agent such as one of $H_2$, $NH_3$, $(SiH_3)_3N$, hydridosilanes (such as $SiH_4$, $Si_2H_6$, $Si_3H_8$, $Si_4H_{10}$, $Si_5H_{10}$, $Si_6H_{12}$), chlorosilanes and chloropolysilanes (such as $SiHCl_3$, $SiH_2Cl_2$, $SIH_3Cl$, $Si_2Cl_6$, $Si_2HCl_5$, $Si_3Cl_8$), alkylsilanes (such as $(CH_3)_2SiH_2$, $(C_2H_5)_2SiH_2$, $(CH_3)SiH_3$, $(C_2H_5)SiH_3$), hydrazines (such as $N_2H_4$, MeHNNH$_2$, MeHNNHMe), organic amines (such as $N(CH_3)H_2$, $N(C_2H_5)H_2$, $N(CH_3)_2H$, $N(C_2H_5)_2H$, $N(CH_3)_3$, $N(C_2H_5)_3$, $(SiMe_3)_2NH)$, pyrazoline, pyridine, B-containing molecules (such as $B_2H_6$, 9-borabicyclo[3,3,1]none, triethylboron, triethylboron, borazine), alkyl metals (such as trimethylaluminum, triethylaluminum, dimethylzinc, diethylzinc), radical species thereof, and mixtures thereof. Preferably, the reducing agent is $H_2$, $NH_3$, $SiH_4$, $Si_2H_6$, $Si_3H_8$, $SiH_2Me_2$, $SiH_2Et_2$, $N(SiH_3)_3$, hydrogen radicals thereof, or mixtures thereof. When a reducing agent is used, the resulting silicon containing film may be pure Si.

The reaction gas may be treated by plasma, in order to decompose the reaction gas into its radical form. $N_2$ may also be utilized as a reducing agent when treated with plasma. For instance, the plasma may be generated with a power ranging from about 50 W to about 500 W, preferably from about 100 W to about 200 W. The plasma may be generated or present within the reactor itself. Alternatively, the plasma may generally be at a location removed from the reactor, for instance, in a remotely located plasma system. One of skill in the art will recognize methods and apparatus suitable for such plasma treatment.

The disclosed Si-containing film forming compositions may also be used with a halosilane or polyhalodisilane, such as hexachlorodisilane pentachlorodisilane, or tetrachlorodisilane, and one or more reactant gases to form SiN or SiCN films, as disclosed in PCT Publication Number WO2011/123792, the entire contents of which are incorporated herein in their entireties and the process of which is disclosed in more detail below.

When the desired silicon-containing film also contains another element, such as, for example and without limitation, Ta, Hf, Nb, Mg, Al, Sr, Y, Ba, Ca, As, Sb, Bi, Sn, Pb, Co, lanthanides (such as Er), or combinations thereof, the reactants may include a metal-containing precursor which is selected from, but not limited to, metal alkyls, such as $Ln(RCp)_3$ or $Co(RCp)_2$, metal amines, such as $Nb(Cp)(NtBu)(Nme_2)_3$ and any combination thereof.

The Si-containing film forming composition and one or more reactants may be introduced into the reaction chamber simultaneously (chemical vapor deposition), sequentially (atomic layer deposition), or in other combinations. For example, the Si-containing film forming composition may be introduced in one pulse and two additional metal sources may be introduced together in a separate pulse [modified atomic layer deposition]. Alternatively, the reaction chamber may already contain the reactant prior to introduction of the Si-containing film forming composition. The reactant may be passed through a plasma system localized or remotely from the reaction chamber, and decomposed to radicals. Alternatively, the Si-containing film forming composition may be introduced to the reaction chamber continuously while other metal sources are introduced by pulse (pulsed-chemical vapor deposition). In each example, a pulse may be followed by a purge or evacuation step to remove excess amounts of the component introduced. In each example, the pulse may last for a time period ranging from about 0.01 s to about 10 s, alternatively from about 0.3 s to about 3 s, alternatively from about 0.5 s to about 2 s. In another alternative, the Si-containing film forming composition and one or more reactants may be simultaneously sprayed from a shower head under which a susceptor holding several wafers is spun (spatial ALD).

In one non-limiting exemplary atomic layer deposition type process, the vapor phase of a Si-containing film forming composition is introduced into the reaction chamber, where it is contacted with a suitable substrate. Excess composition may then be removed from the reaction chamber by purging and/or evacuating the reaction chamber. An oxygen source is introduced into the reaction chamber where it reacts with the absorbed organodisilane precursor in a self-limiting manner. Any excess oxygen source is removed from the reaction chamber by purging and/or evacuating the reaction chamber. If the desired film is a silicon oxide film, this two-step process may provide the desired film thickness or may be repeated until a film having the necessary thickness has been obtained.

Alternatively, if the desired film is a silicon metal oxide film (i.e., $SiMO_x$, wherein x may be 4 and M is Ta, Hf, Nb, Mg, Al, Sr, Y, Ba, Ca, As, Sb, Bi, Sn, Pb, Co, lanthanides (such as Er), or combinations thereof), the two-step process above may be followed by introduction of a vapor of a second precursor into the reaction chamber. The second precursor will be selected based on the nature of the $SiMO_x$ film being deposited. After introduction into the reaction chamber, the second precursor is contacted with the substrate. Any excess second precursor is removed from the reaction chamber by purging and/or evacuating the reaction chamber. Once again, an oxygen source may be introduced into the reaction chamber to react with the second precursor. Excess oxygen source is removed from the reaction chamber by purging and/or evacuating the reaction chamber. If a desired film thickness has been achieved, the process may be terminated. However, if a thicker film is desired, the entire four-step process may be repeated. By alternating the provision of the Si-containing film forming composition, second precursor, and oxygen source, a film of desired composition and thickness can be deposited.

Additionally, by varying the number of pulses, films having a desired stoichiometric M:Si ratio may be obtained. For example, a $SiMO_2$ film may be obtained by having one pulse of the Si-containing film forming composition and one pulse of the second precursor, with each pulse being followed by pulses of the oxygen source. However, one of ordinary skill in the art will recognize that the number of pulses required to obtain the desired film may not be identical to the stoichiometric ratio of the resulting film.

In another alternative and as disclosed in WO WO2011/123792, dense SiCN films may be deposited using an ALD method with hexachlorodisilane (HCDS) or pentachlorodisilane (PCDS), the disclosed Si-containing film forming composition, and an ammonia co-reactant. The reaction chamber may be controlled at 5 Torr, 550° C., with a 55 sccm continuous flow of Ar. An approximately 10 second long pulse of the Si-containing film forming composition at a flow rate of approximately 1 sccm is introduced into the reaction chamber. The composition is purged from the reaction chamber with an approximately 55 sccm flow of Ar for approximately 30 seconds. An approximately 10 second pulse of HCDS at a flow rate of approximately 1 sccm is introduced into the reaction chamber. The HCDS is purged from the reaction chamber with an approximately 55 sccm flow of Ar for approximately 30 seconds. An approximately 10 second long pulse of $NH_3$ at a flow rate of approximately 50 sccm is introduced into the reaction chamber. The $NH_3$ is purged from the reaction chamber with an approximately 55 sccm flow of Ar for approximately 10 seconds. These 6 steps are repeated until the deposited layer achieves a suitable thickness. One of ordinary skill in the art will recognize that the introductory pulses may be simultaneous when using a spatial ALD device. As described in PCT Pub No WO2011/123792, the order of the introduction of the precursors may be varied and the deposition may be performed with or without the $NH_3$ co-reactant in order to tune the amounts of carbon and nitrogen in the SiCN film.

In yet another alternative, a silicon-containing film may be deposited by the flowable PECVD method disclosed in U.S. Pat. App. Pub. No. 2014/0051264 using the disclosed compositions and a radical nitrogen- or oxygen-containing co-reactant. The radical nitrogen- or oxygen-containing co-reactant, such as $NH_3$ or $H_2O$ respectively, is generated in a remote plasma system. The radical co-reactant and the vapor phase of the disclosed compositions are introduced into the reaction chamber where they react and deposit the initially flowable film on the substrate. Applicants believe that the nitrogen atoms of the disclosed N-containing organodisilane precursors and/or the sulfur atoms of the disclosed S-containing organodisilane precursors may help to further improve the flowability of the deposited film, resulting in films containing fewer voids.

Also disclosed are methods of using the disclosed Si-containing film forming compositions in casting deposition methods, such as spin coating, spray coating, dip coating or slit coating techniques. The disclosed methods provide for the use of the Si-containing film forming composition for deposition of silicon-containing films. The disclosed methods may be useful in the manufacture of semiconductor, photovoltaic, LCD-TFT, or flat panel type devices. The method includes: applying the liquid form of the disclosed Si-containing film forming composition on a substrate in a reactor: and forming the Si-containing layer on the substrate. As discussed previously, the liquid form of the disclosed Si-containing film forming composition may be a neat solution of the organodisilane precursor or a mixture of the precursor with a solvent and optional pH adjusters or surfactants. The liquid form of the disclosed Si-containing film forming composition may be applied directly to the center of the substrate or may be applied to the entire substrate by spraying. When applied directly to the center of the substrate, the substrate may be spun to utilize centrifugal forces to evenly distribute the composition over the substrate. Alternatively, the substrate may be dipped in the Si-containing film forming composition. The resulting film may be dried at an appropriate temperature for a period of time to vaporize any solvent or volatile components of the film. One of ordinary skill in the art would recognize the appropriate temperature selection based on the solvent to be evaporated. During the vaporization process, a mist of water may be sprayed onto the substrate to promote the hydrolysis reaction of the film.

The disclosed organodisilane precursors in the Si-containing film forming compositions may prove useful as monomers for the synthesis of silicon containing polymers. The Si-containing film forming compositions may be used to form spin-on dielectric film formulations, for patternable films, or for anti-reflective films. For example, the disclosed Si-containing film forming compositions may comprise a solvent and applied to a substrate to form a film. If necessary, the substrate may be rotated to evenly distribute the Si-containing film forming composition across the substrate. One of ordinary skill in the art will recognize that the viscosity of the Si-containing film forming compositions will contribute as to whether rotation of the substrate is necessary. The resulting film may be heated under an inert gas, such as Argon, Helium, or nitrogen and/or under reduced pressure. Alternatively, electron beams or ultraviolet radiation may be applied to the resulting film. The 8-9 hydrolysable groups of the disclosed organodisilane precursors (i.e., the direct Si—Si, Si—N, Si—O, Si—S, or Si—H bonds) may prove useful to increase the connectivity of the polymer obtained.

The silicon-containing films resulting from the processes discussed above may include Si, SiC, $SiO_2$, SiN, SiON, SiCN, SiCOH, pSiCOH, or $MSiO_x$, wherein M is an element such as Hf, Zr, Ti, Nb, Ta, or Ge, and x may be 0-4, depending of course on the oxidation state of M. One of ordinary skill in the art will recognize that by judicial selection of the appropriate organodisilane precursor and co-reactants, the desired film composition may be obtained.

Upon obtaining a desired film thickness, the film may be subject to further processing, such as thermal annealing, furnace-annealing, rapid thermal annealing, UV or e-beam curing, and/or plasma gas exposure. Those skilled in the art recognize the systems and methods utilized to perform these additional processing steps. For example, the silicon-containing film may be exposed to a temperature ranging from approximately 200° C. and approximately 1000° C. for a time ranging from approximately 0.1 second to approximately 7200 seconds under an inert atmosphere, a H-containing atmosphere, a N-containing atmosphere, an O-containing atmosphere, or combinations thereof. Most preferably, the temperature is 600° C. for less than 3600 seconds under a H-containing atmosphere. The resulting film may contain fewer impurities and therefore may have improved performance characteristics. The annealing step may be performed in the same reaction chamber in which the deposition process is performed. Alternatively, the substrate may be removed from the reaction chamber, with the annealing/flash annealing process being performed in a separate apparatus. Any of the above post-treatment methods, but especially thermal annealing, has been found effective to reduce carbon and nitrogen contamination of the silicon-containing film.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

We claim:

1. A Si-containing film forming composition comprising an organodisilane precursor having the formula:

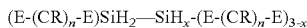

wherein x is 2 or 3; each n is independently 1 or 3; each (E-(CR)$_n$-E) group is a monoanionic bidentate ligand bonding to the Si through each E; each E is independently chosen from NR, O or S; and each R is independently selected from the group consisting of H, a C1 to C6 alkyl group, and a C3-C20 aryl or heterocycle group.

2. The Si-containing film forming composition of claim 1, wherein the organodisilane precursor has the formula:

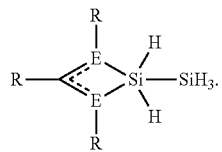

3. The Si-containing film forming composition of claim 2, wherein the organodisilane precursor has the formula:

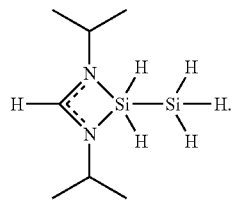

4. The Si-containing film forming composition of claim 2, wherein the organodisilane precursor has the formula:

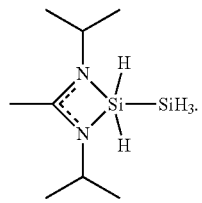

5. The Si-containing film forming composition of claim 2, wherein the organodisilane precursor has the formula:

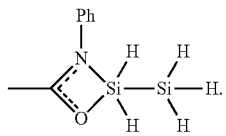

6. The Si-containing film forming composition of claim 2, wherein the organodisilane precursor has the formula:

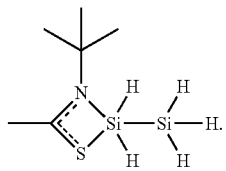

7. The Si-containing film forming composition of claim 1, wherein the organodisilane precursor has the formula:

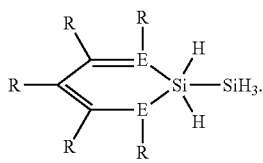

8. The Si-containing film forming composition of claim 1, wherein the organodisilane precursor has the formula:

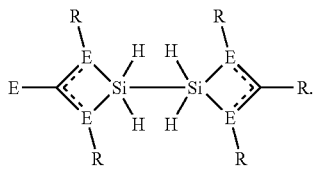

9. The Si-containing film forming composition of claim 8, wherein the organodisilane precursor has the formula:

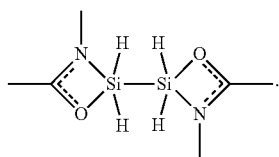

10. The Si-containing film forming composition of claim 1, wherein the organodisilane precursor has the formula:

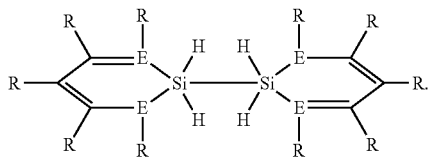

11. A method of deposition a Si-containing layer on a substrate, the method comprising:

introducing a vapor of the organodisilane precursor of claim 1 into a reactor having a substrate disposed therein; and depositing at least part of the organodisilane precursor onto the substrate to form a Si-containing layer using a vapor deposition method.

12. The method of claim 11, further comprising introducing a co-reactant into the reactor.

13. The method of claim 11, wherein the vapor deposition process is a chemical vapor deposition process.

14. The method of claim 11, wherein the vapor deposition process is an atomic layer deposition (ALD) process.

15. A method of forming a Si-containing film on a substrate, the method comprising forming a solution comprising the Si-containing film forming composition of claim 1; and contacting the solution with the substrate via a spin coating, spray coating, dip coating, or slit coating technique to form the Si-containing film.

16. The method of claim 11, wherein the organodisilane precursor has the formula:

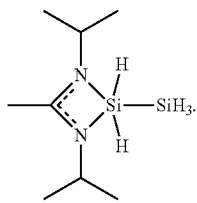

17. The method of claim 11, wherein the organodisilane precursor has the formula:

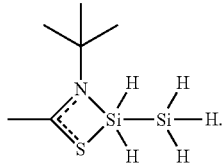

18. The method of claim 11, wherein the organodisilane precursor has the formula:

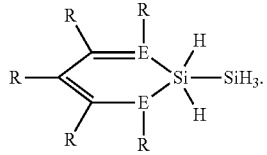

19. The method of claim 15, wherein the organodisilane precursor has the formula:

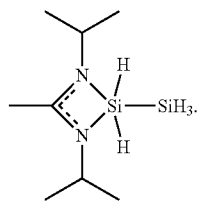

20. The method of claim 15, wherein the organodisilane precursor has the formula:

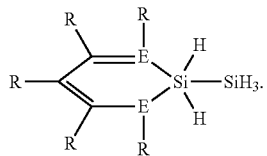

* * * * *